(12) United States Patent
Wu et al.

(10) Patent No.: US 7,453,960 B1
(45) Date of Patent: *Nov. 18, 2008

(54) LDPC ENCODER AND ENCODER AND METHOD THEREOF

(75) Inventors: Zining Wu, Los Altos, CA (US); Gregory Burd, San Jose, CA (US)

(73) Assignee: Marvell International Ltd., Hamilton (BM)

(*) Notice: Subject to any disclaimer, the term of this patent is extended or adjusted under 35 U.S.C. 154(b) by 289 days.

This patent is subject to a terminal disclaimer.

(21) Appl. No.: 11/397,318

(22) Filed: Apr. 4, 2006

Related U.S. Application Data

(63) Continuation of application No. 09/730,603, filed on Dec. 7, 2000, now Pat. No. 7,184,486, which is a continuation-in-part of application No. 09/559,186, filed on Apr. 27, 2000, now Pat. No. 6,888,897, application No. 09/730,603.

(60) Provisional application No. 60/214,781, filed on Jun. 28, 2000.

(51) Int. Cl.
*H04D 1/00* (2006.01)
*H04L 27/06* (2006.01)

(52) U.S. Cl. .................. 375/340; 375/341; 714/799; 714/800; 714/801; 714/803; 714/805; 708/530; 708/531

(58) Field of Classification Search ......... 714/799–801, 714/803, 805; 375/340, 341
See application file for complete search history.

(56) References Cited

U.S. PATENT DOCUMENTS 4,295,218 A 10/1981 Tanner

| | | |
|---|---|---|
| 4,601,044 A | 7/1986 | Kvomer, III et al. |
| 5,157,671 A * | 10/1992 | Karplus .................. 714/752 |
| 5,537,444 A | 7/1996 | Nill et al. |
| 5,757,821 A | 5/1998 | Jamal et al. |
| 5,926,232 A | 7/1999 | Mangold et al. |
| 5,930,272 A | 7/1999 | Thesling |
| 5,933,462 A | 8/1999 | Viterbi et al. |
| 5,949,831 A | 9/1999 | Coker et al. |
| 5,974,540 A | 10/1999 | Morikawa et al. |
| 5,983,385 A | 11/1999 | Khayrallah et al. |
| 6,002,716 A | 12/1999 | Meyer et al. |
| 6,009,549 A | 12/1999 | Bliss et al. |

(Continued)

FOREIGN PATENT DOCUMENTS

| | | |
|---|---|---|
| JP | 2004164767 | 10/2004 |
| WO | WO 96/37050 | 11/1996 |
| WO | WO 00/19616 A2 | 4/2000 |

OTHER PUBLICATIONS

U.S. Appl. No. 09/559,186, filed Apr. 27, 2000, Nazari et al.
U.S. Appl. No. 09/730,597, filed Dec. 7, 2000, Burd et al.
U.S. Appl. No. 09/730,598, filed Dec. 7, 2000, Wu et al.
U.S. Appl. No. 09/730,752, filed Dec. 7, 2000, Burd et al.
U.S. Appl. No. 09/901,507, filed Jul. 9, 2001, Wu et al.

(Continued)

*Primary Examiner*—Curtis B Odom

(57) ABSTRACT

A decoder for decoding low-density parity-check codes comprises a first calculator to calculate $LLrR_{ml}$, for each parity check equation, at iteration i−1. A detector detects $LLrR_{ml}$, at iteration i, in response to the first calculator. A second calculator calculates $LLrQ_{Lm}$, for each parity check equation, at iteration i in response to the detector. $LLrQ_{Lm}$ represents information from bit node l to equation node m, one for each connection. $LLrR_{ml}$ represents information from equation node m to bit node l, one for each connection. The first calculator is responsive to the second calculator.

39 Claims, 17 Drawing Sheets

U.S. PATENT DOCUMENTS

| | | | |
|---|---|---|---|
| 6,021,518 | A | 2/2000 | Pelz |
| 6,023,783 | A | 2/2000 | Divsalar et al. |
| 6,028,728 | A | 2/2000 | Reed |
| 6,081,918 | A | 6/2000 | Spielman |
| 6,145,114 | A | 11/2000 | Crozier et al. |
| 6,145,144 | A | 11/2000 | Poehlmann et al. |
| 6,161,209 | A | 12/2000 | Moher |
| 6,182,261 | B1 | 1/2001 | Haller et al. |
| 6,219,817 | B1 | 4/2001 | Holman |
| 6,427,220 | B1 | 7/2002 | Vityaev |
| 6,438,180 | B1 | 8/2002 | Kavic et al. |
| 6,539,367 | B1 * | 3/2003 | Blanksby et al. ............. 706/14 |
| 6,581,181 | B1 | 6/2003 | Sonu |
| 6,634,007 | B1 | 10/2003 | Koetter et al. |
| 6,691,263 | B2 | 2/2004 | Vasic et al. |
| 6,708,308 | B2 | 3/2004 | De Souza et al. |
| 6,715,121 | B1 | 3/2004 | Laurent |
| 7,116,710 | B1 * | 10/2006 | Jin et al. .................... 375/240 |
| 7,184,486 | B1 * | 2/2007 | Wu et al. .................... 375/262 |

OTHER PUBLICATIONS

Shoemake and Heegard, "Computationally Efficient Turbo Decoding with Bi-Directional Viterbi Algorithm (BIVA)", IEEE, ISIT 1997; p. 228.

L.H.C. Lee, Computation of the Right-Inverse of G(D) and the Left-Inverse of H(D), Jun. 21, 1990, IEEE vol. 26, No. 13, pp. 904-906.

Oberg, Mats, et al, "Parity Check Codes for Partial Response Channel", IEEE Global Telecommunications Conference—Globecom '99, pp. 717-722, 1999.

Hagenauer, Joachim, et al, "A Viterbi Algorithm with Soft-Decision Outputs and its Appilcation," IEEE Globecom '90, pp. 1680-1686 (47.1.1-47.1.7), Nov. 1989.

Viterbi, Andrew J., "An Intuitive Justification and a Simplified Implementation of the Map Decoder for Convolutional Codes", IEEE Journal On Selected Areas In Communication, vol. 16, No. 2, Feb. 1995; 4 pages.

MacKay, David J.C., "Good Error-Correcting Codes Based On Very Sparse Matrices", IEEE Transactions On Information Theory, vol. 45, No. 2, Mar. 1999; 34 pages.

Gallager, Robert G., "Low Density Parity-Check Codes", 1963; 90 pages.

Wu, Zining, "Coding and Iterative Detection For Magnetic Recording Channels", The Kluwer International Series in Engineering And Computer Science; 1999, 89 pages.

Wu, Zining, Coding, Iterative Detection And Timing Recovery For Magnetic Recording Channels, A Dissertation; Aug. 1999; 157 pages.

* cited by examiner

LDPC ENCODER AND ENCODER AND METHOD THEREOF

CROSS-REFERENCE TO RELATED APPLICATIONS

The present invention is a continuation of Ser. No. 09/730,603, filed on Dec. 7, 2000, which claims priority from Ser. No. 60/214,781, filed Jun. 28, 2000 and is a continuation-in-part of Ser. No. 09/559,186, filed on Apr. 27, 2000. The disclosures of the above applications are incorporated herein by reference in their entirety. The present invention is related to the following commonly-assigned, co-pending applications:

"LDPC Encoder and Method Thereof", filed on Dec. 7, 2000 and assigned application Ser. No. 09/730,752, the contents of which are incorporated herein by reference, in its entirety.

"Address Generator for LDPC Encoder and Decoder and Method Thereof", U.S. Pat. No. 6,965,654, issued on Nov. 15, 2005, the contents of which are incorporated herein by reference in its entirety.

"Parity Check Matrix and Method of Forming Thereof", U.S. Pat. No. 7,000,177, the contents of which are incorporated herein by reference in its entirety.

BACKGROUND OF THE INVENTION

1. Field of the Invention

The present invention relates generally to a linear block decoder in a data transmission system. More particularly, the present invention relates to a low density parity-check code (LDPC) decoder a read channel in a disk drive system.

2. Description of the Related Art

FIG. 1 illustrates a conventional digital data transmission system. As shown therein, a digital data transmission system comprises a transmitting section 300 for transmitting user data to receiver 500 via communication channel 401.

The operation of transmission section 300 will now be explained. Prior to processing by transmitting section 300, input or user data maybe encoded with an error correcting code, such as the Reed/Solomon code, or run length limited encoded (RLL) or a combination thereof by encoder 302. The encoded output encoder 302 is then interleaved by deinterleaver 308 for input to linear block code encoder 304 which generates parity data in a known manner utilizing linear block codes. One example of a linear block code is a low-density parity-check code (LDPC) which is discussed by Robert G. Gallager in *Low-Density Parity-Check Codes*, 1963, M.I.T. Press and by Zining Wu in *Coding and Iterative Detection For Magnetic Recording Channels*, 2000, Kluwer Academic Publishers, the contents of each of which are incorporated in their entirety by reference. Deinterleaver 308 permutes the data so that the same data is reordered before encoding by linear block code encoder 304. By permuting or redistributing the data, deinterleaver 308 attempts to reduce the number of nearest neighbors of small distance error events. User data at the output of encoder 302 is referred to as being in the channel domain; that is the order in which data is transmitted through the channel. The order of data processed by deinterleaver 308 is referred to as being in the linear block code domain. The parity data from linear block code encoder 304 is combined with the data encoded by encoder 302 by multiplexer 306 for input to channel transmitter 310.

Transmitter 310 transmits the combined user and parity data from multiplexer 306 typically as an analog signal over communication channel 401 in the channel domain. Communication channel 401 may include any wireless, wire, optical and the like communication medium. Receiver 500 comprises a front-end circuit 502 comprising analog to digital and equalization circuits. The digital signal front-end circuit 502 is input to soft channel decoder 504, which provides probability information of the detected data. Soft channel decoder 504 may be implemented by a Soft Viterbi Detector or the like. The output of the soft channel decoder 504, which is in the channel domain, is converted into the linear block code domain by deinterleaver 510. Deinterleaver 510 is constructed similarly to deinterleaver 308. Soft linear block code decoder 506 utilizes this information and the parity bits to decode the received data. One output of soft linear block code decoder 506 is fed back to soft channel decoder 504 via interleaver 512, which converts data in the linear block code domain to the channel domain. Deinterleaver Interleaver 512 is constructed to perform the reverse operations of deinterleaver 510. Soft channel decoder 504 and soft linear block code decoder 506 operate in an iterative manner to decode the detected data.

The other output of soft linear block code decoder 506 is converted from the linear block domain to the channel domain by interleaver 514. Interleaver 514 is constructed similarly to interleaver 512. The output of interleaver 514 is passed on for further processing to decoder 508. Decoder 508 is implemented to perform the reverse operations of encoder 302.

SUMMARY OF THE INVENTION

A decoder for decoding low-density parity-check codes comprises a first calculator to calculate $LLrR_{ml}$, for each parity check equation, at iteration i–1. A detector detects $LLrR_{ml}$, at iteration i, in response to the first calculator. A second calculator calculates $LLrQ_{Lm}$, for each parity check equation, at iteration i in response to the detector. $LLrQ_{Lm}$ represents information from bit node l to equation node m, one for each connection. $LLrR_{ml}$ represents information from equation node m to bit node l, one for each connection. The first calculator is responsive to the second calculator. Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts.

DESCRIPTION OF THE PREFERRED EMBODIMENTS

Figure 1:
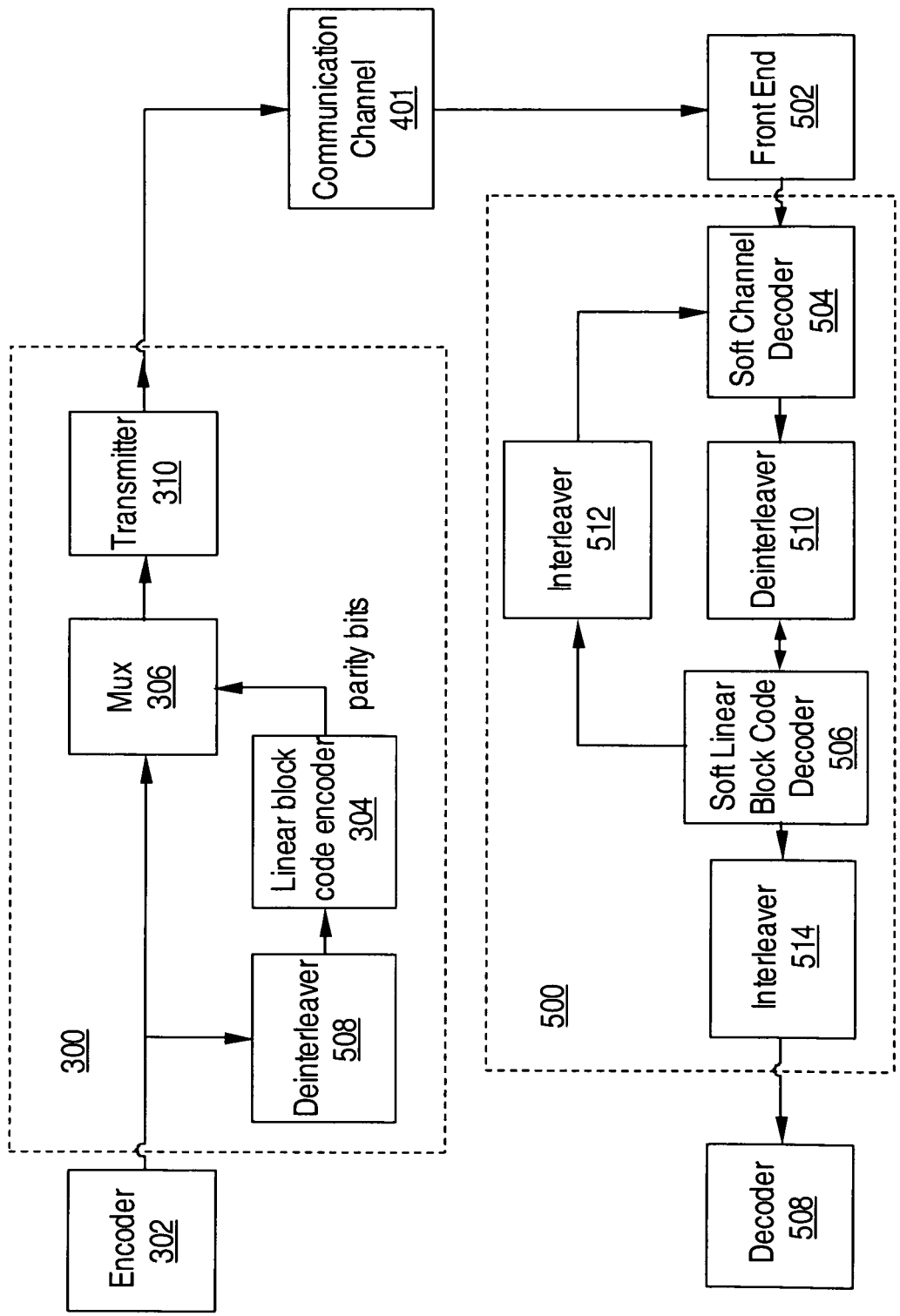
FIG. 1 is a block diagram of a conventional data transmission system.
Figure 2:
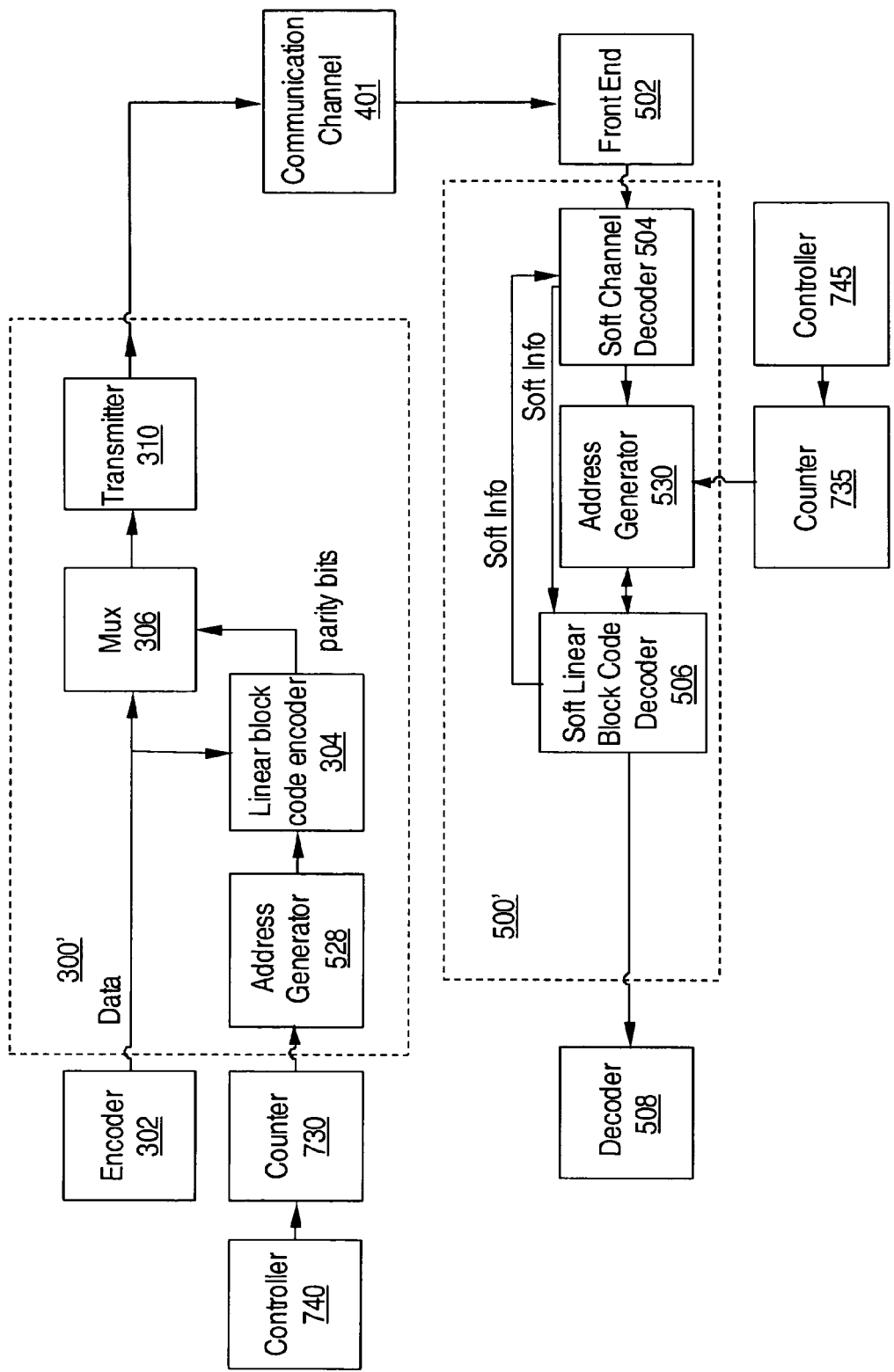
FIG. 2 is a block diagram of a data transmission system in accordance with the present invention.

Reference is now made to FIG. 2, which is a block diagram of a data transmission system in accordance with the present invention. In general as shown therein, a digital data transmission system comprises a transmitting section 300' for transmitting user data to receiver 500' via communication channel 401. The inventors have observed that a linear block code encoder is not dependent on a position of a bit interleaved. Rather the linear block code encoder only requires a list of equations for a given bit. In other words, there is no need to process the data in the order defined by the interleaver, instead data may be processed in the same order as it is written to the channel. This can be accomplished by incorporating an address generator to provide an address of the appropriate equation of the linear block code encoder. This principle can be similarly applied to the soft linear block decoder. As a result, deinterleaver 308 of the conventional system is now replaced by address generator 328, and deinterleaver 510 is now replaced by address generator 530. Accordingly, there is no requirement for the physical interleaving of data in the receiver 500', since the data remains in the same order as the order of bits of data in the channel throughout this system. The order of bits of data transmitted through the channel is referred to as the channel domain.

The operation of transmission section 300' will now be explained. Prior to processing by transmitting section 300', as in the conventional system, input or user data maybe encoded with an error correcting code, such as the Reed/Solomon code, or run length limited encoded (RLL) or a combination thereof by encoder 302. Addresses for the parity equations of linear block code encoder 304 are generated by address generator 328 in accordance with an index of the bits of data, the index being determined by address generator 328. Address generator 328 is responsive to counter 730 under the control of controller 740. Controller 740 synchronizes counter 730 to the output of encoder 302 so that counter 730 can provide a count of the number of bits in a codeword output by encoder 302 and a count of the number of codewords. In the preferred embodiment the data block size is 5000 bits.

Referring again to FIG. 2, linear block code encoder 304 utilizes the user data and address from address generator 328 to provide the parity bits to multiplexer 306. Address generator 328 is described in more detail in commonly assigned, copending patent application entitled "Address Generator for LDPC Encoder and Decoder and Method Thereof" filed on even date and assigned application Ser. No. 09/730,597, the contents of which are incorporated herein by reference. Linear block code encoder 304 is preferably implemented as a low-density parity-check code (LDPC) encoder as described in commonly assigned, copending patent application entitled "LDPC Encoder and Method Thereof", filed on even date and assigned application Ser. No. 09/730,752, the contents of which are incorporated herein by reference. The parity data from linear block code encoder 304 is combined with the data encoded by encoder 302 by multiplexer 306 for input to channel transmitter 310. In the preferred embodiment, the combined data consists of series of a pair parity bits followed by 34 bits of user data. This constraint is established by RLL constraint encoder 302.

Transmitter 310 transmits the combined user and parity data from multiplexer 306 typically as an analog signal over communication channel 401 in the channel domain. Communication channel 401 may include any wireless, wire, optical, magnetic and the like.

Receiver 500' comprises an analog to front-end circuit 502 comprising analog to digital and equalization circuits. The digital signal from front-end circuit 502 is input to soft channel decoder 504, which provides soft or probabilistic information of the detected data to soft linear block decoder 506. Soft channel decoder may be implemented as a Soft Viterbi Detector or the like, and address generator 530 may be constructed similarly as address generator 328 in transmission section 300'. In the preferred the Soft Viterbi Detector may be implemented with a Soft-Output Viterbi Algorithm which is described in J. Hagenauer and P. Hoeher: "A Viterbi algorithm with soft-decision outputs and its applications", Proc. IEEE GLOBECOM '90, Dallas, Tex., pp. 47.1.1-47.1.7, November 1989, the contents of which are incorporated by reference.

The soft information output by soft channel decoder 504 remains in the channel domain and is decoded by soft linear block code decoder 506, in accordance with the address of the parity equations generated by address generator 530. Address generator 530 is responsive to counter 735 under the control of controller 745. Controller 745 synchronizes counter 735 to the output of soft channel decoder 504 so that counter 735 can provide a count of the number of bits in a codeword output by soft channel decoder 504 and a count of the number of codewords.

Soft linear block code decoder 506 operates in combination with soft channel decoder 504 and address generator 530 in an iterative fashion. Soft linear block code decoder is preferably implemented as a low-density parity-check code (LDPC) decoder, as described in detail hereinbelow. It is noted that since the soft information from soft channel decoder 504 to soft linear block code decoder 506 are both in the channel domain, thus as noted above, there is no need for any interleavers or deinterleavers in receiver 500'.

After the iterative process has completed, the output of soft linear block code decoder 506 is passed on for further processing to decoder 508. Decoder 508 is implemented to perform the reverse operations of encoder 302 or correct for any data errors.

Figure 3:
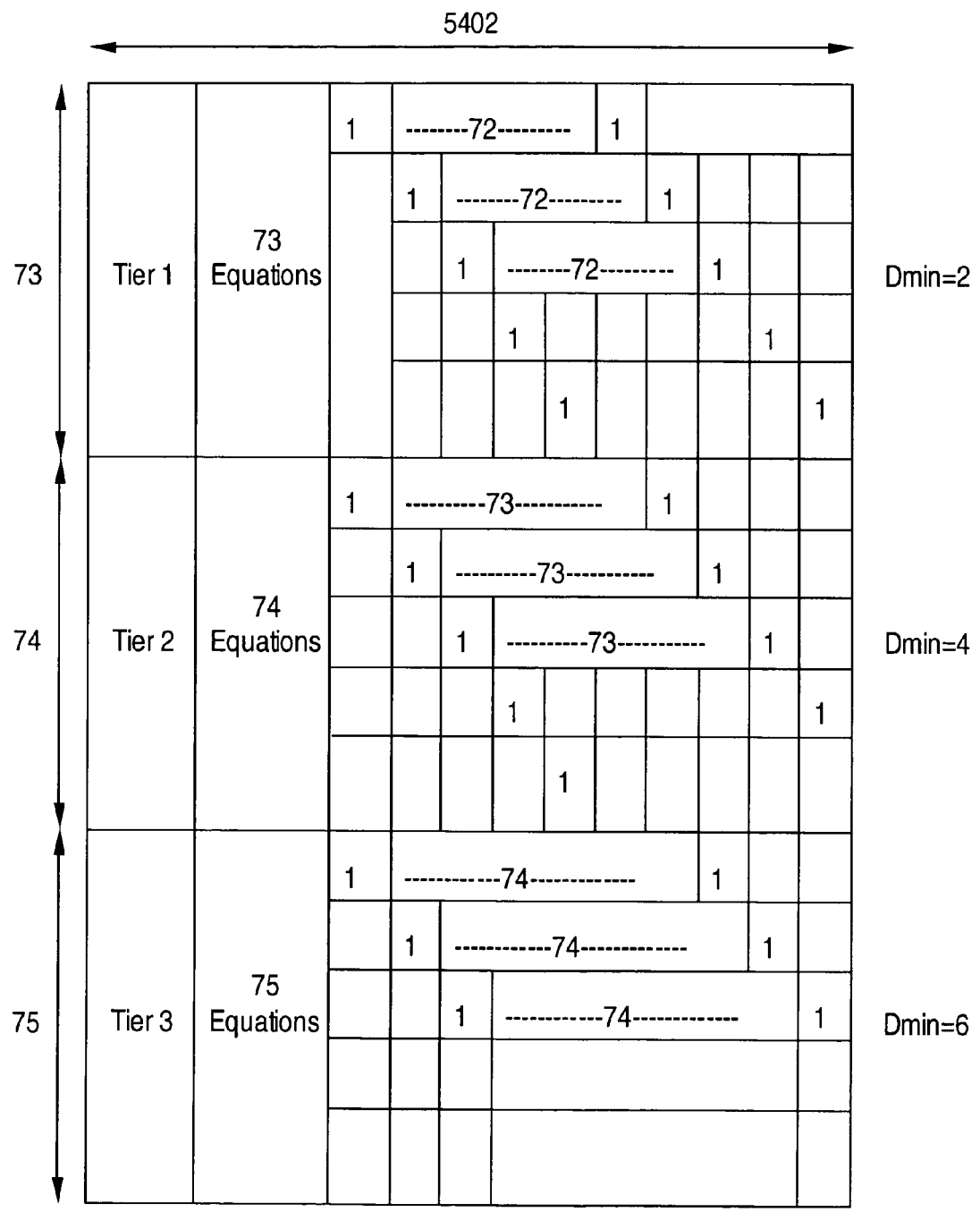
FIG. 3 is an example of a parity check matrix in accordance with the present invention.

Prior to discussing the construction and operation of the LPDC decoder, reference is now made to FIG. 3 for an explanation of the parity check matrix. FIG. 3 shows only one example of a parity check matrix. Of course, other parity check matrices are contemplated. The preferred matrix is 222 rows (or equations) by 5402 columns, which comprises 220 linearly independent rows (where 5402=73*74). The matrix can be divided into three tiers of equations having 73, 74 and 75 equations, respectively. The set of independent rows can be obtained by canceling the last row of the second tier and third tier, namely the $147^{th}$ row and the $222^{nd}$ row. As shown in FIG. 3, the following table shows the values of the elements in the matrix:

| Tier | i$^{th}$ position | i$^{th}$ position |
|---|---|---|
| 1 | 1 if r = i(mod73) | 0 if r ≠ i(mod73) |
| 2 | 1 if r = i(mod74) | 0 if r ≠ i(mod74) |
| 3 | 1 if r = i(mod75) | 0 if r ≠ i(mod75) |

A matrix having 5402 columns can process a maximum LDPC codeword of 5402 bits. Of course, as will be appreciated by one of ordinary skill in the art, the matrix may be truncated to accommodate a smaller block, however the matrix must be at least 222×4366 which is dependent on the constraint of encoder 302. This constraint is for example a RLL constraint. The preferred matrix contains no cycles, since a matrix having cycles has degraded performance that degrades significantly. With the first tier only, the parity check matrix has a $D_{min}$=2; by adding the second tier, the parity check matrix has a $D_{min}$=4; and by adding the third tier, the parity check matrix has a $D_{min}$=6. A further description of the parity check matrix is provided in commonly assigned, copending application entitled, "Parity Check Matrix and Method of Designing Thereof", filed on even date and assigned application Ser. No. 09/730,598, the contents of which are incorporated herein by reference.

The LDPC decoder is preferably implemented using the sum-product algorithm, which is described by Zining Wu in *Coding and Iterative Detection For Magnetic Recording Channels*, 2000, Kluwer Academic Publishers, the contents of each of which are incorporated in its entirety by reference.

A linear code is a set of codewords, x, satisfying the matrix equation (1)

$$H \cdot x = 0 \quad (1),$$

where H is an M×L matrix, and x is a L×1 vector.

The parity check matrix for an LDPC encoder/decoder is sparse, that is a small portion of the elements being one, all other elements being zero. An example of a parity check matrix is shown in equation 2 that corresponds to the factor graph shown in FIG. 6.

$$H = \begin{bmatrix} 1 & 0 & 1 & 1 \\ 0 & 1 & 1 & 1 \end{bmatrix} \quad (2)$$

which defines the following parity-check equations for the codeword x $$x1+x3+x4=0$$

$$x2+x3+x4=0$$

Figure 6:
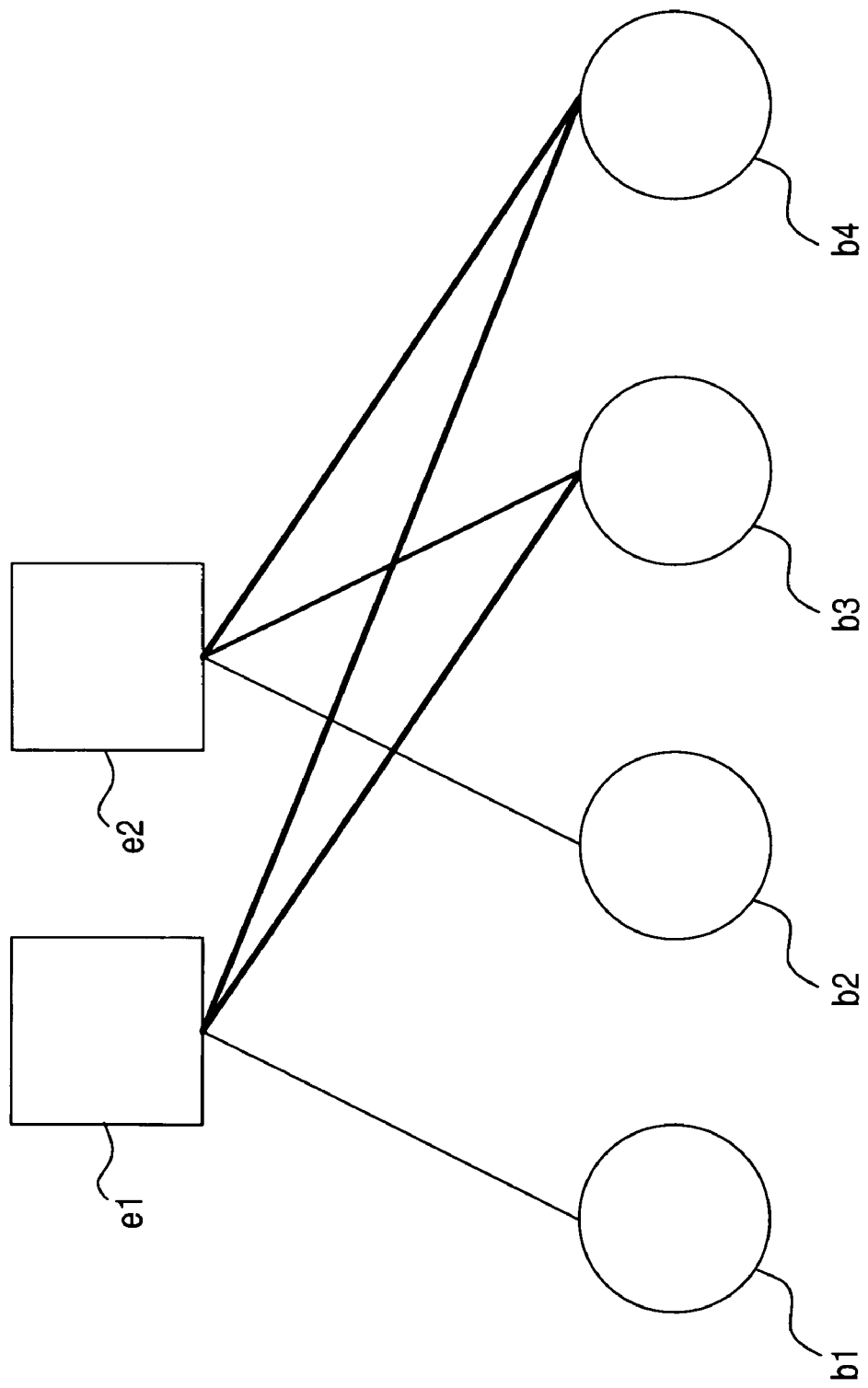
FIG. 6 is an example of a factor graph.

FIG. 6 is a factor graph of the parity matrix of equation 2. The factor graph contains two types of nodes the bit node (e.g. b1, b2, b3, and b4) and the check nodes (e.g. e1, e2). Each bit node corresponds to a bit in the codeword, and each check node (also referred to herein as an "equation node") represents a parity-check equation (i.e., a row in the parity check matrix H). Hence, the factor graph for an LDPC code with an M×L parity check matrix H contains M check nodes and L bit nodes. An edge between a check node and a bit node exists if and only if the bit participates in the parity-check equation represented by the check node. The factor graph shown in FIG. 3 is "bipartite" in which the nodes can be separated to two groups, namely check nodes and bit nodes. Connections are allowed only between nodes in different groups.

A cycle in a factor graph refers to a finite set of connected edges that start and end at the same node. The bold lines in FIG. 6 represent a cycle length of four. As can be appreciated by one of ordinary skill in the art, four is the shortest cycle length a parity check matrix can have.

In the sum-product decoding algorithm, there are four types of soft information circulating in the decoding process:
1. $LLrP_L$: The soft information from channel APP (a posteriori probability) decoder or soft channel decoder 504 for the first iteration or from decision aided equalization circuit 856 for subsequent iterations, one for each bit.
2. $LLrQ_{Lm}$: The information from bit node l to equation node m, one for each connection.
3. $LLrR_{mL}$: The information from equation node m to bit node l, one for each connection.
4. $LLrAPP_L$: the overall soft information after each iteration, one for each bit.

Each iteration performs three steps of operations (superscripts denote iteration number):
1. Each bit calculates the information LLrQ that it passes to the connecting equations, which is the sum of the extrinsic information LLrR from the previous iteration with the channel information LLrP from the current iteration, excluding the extrinsic information from the same equation, i.e.:

$$LLrQ_{Lm}^i = LLrP_L^i + \sum_{m' \neq m} LLrR_{m'L}^{i-1} \quad (3)$$

2. Each check equation (each row) calculates the extrinsic information for each involved bit. The "LLRXOR" (Σ ⊕) denotes the LLR (log-likelihood ratio) operation discussed below.

$$LLrR_{mL}^i = \sum_{l' \neq l} \bigoplus LLrQ_{L'm}^i \quad (4)$$

3. Each bit calculates the overall soft information by summing up all the $LLrR_{mL}$'s and the $LLrP_L$ $$LLrAPP_L^i := LLrP_L^i + \sum_m LLrR_{mL}^i \quad (5)$$

The "LLRXOR" operation is defined as:

$$LLRXOR(y, z) = \log(e^y + e^z) - \log(e^{y+z} + e^0) = \quad (6)$$
$$\max(y, z) + \log(1 + e^{-|y-z|}) - \max(x+y, 0) - \log(1 + e^{-|y+z|})$$

where $\log(1+e^{-|a|})$ can be implemented with a look-up table. Such an operation requires 5 additions, 2 absolute values and two table look-ups from a look-up table. This procedure is referred to as the "Sum Product" (SP) algorithm.

The "LLRXOR" operation can be further simplified by eliminating the table look-ups, i.e. omitting the $\log(1+e_{-|a|})$ term in equation (6). The equation is simplified as follows:

$$LLRXOR(y,z)=-\text{sign}(y)\text{sign}(z)\min(|y|,|z|) \quad (7).$$

As is apparent to one of ordinary skill in the art, equation (7) requires only absolute value and comparison operations. This operation is referred to as the "Signed Sum Product" (SSP) algorithm.

Figure 7:
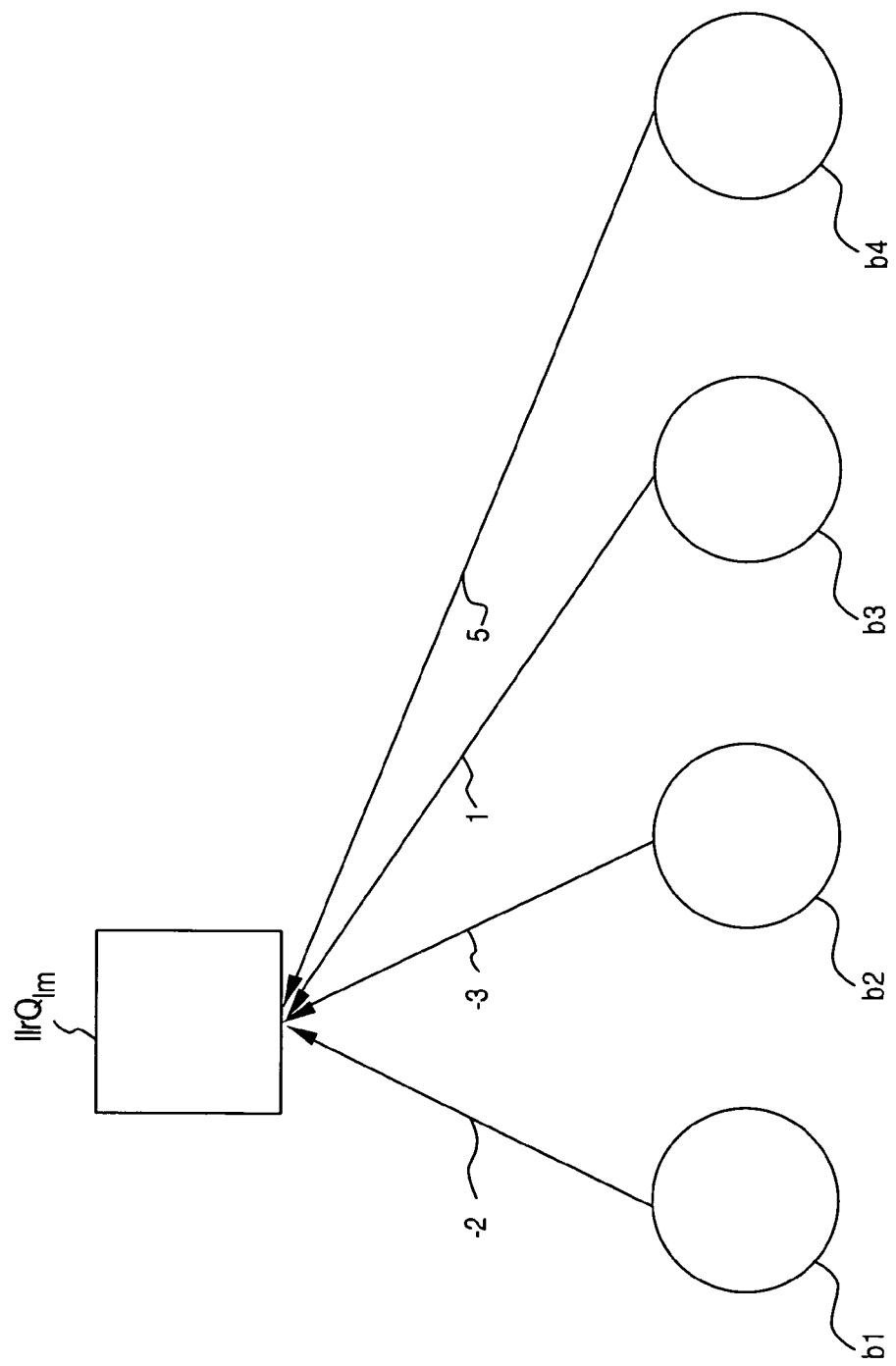
FIG. 7 is an example of a factor graph illustrating the calculation of $LLrQ_{Lm}$.
Figure 8:
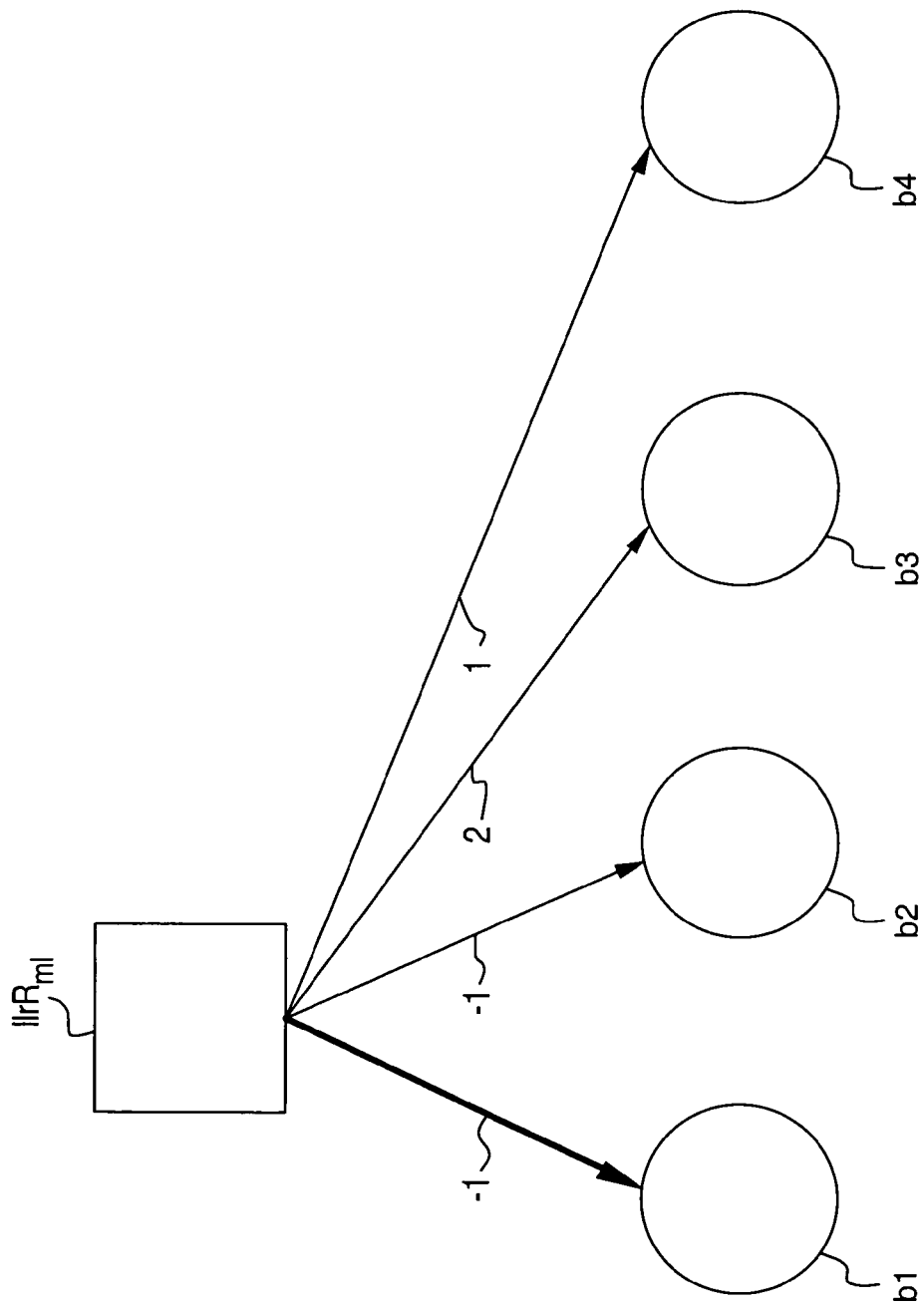
FIG. 8 is an example of a factor graph illustrating the calculation of $LLrR_{ml}$.

In the SSP algorithm, the magnitudes of the extrinsic information conveyed in each equation are determined by the two log-likelihood ratios with the smallest amplitudes. Other LLR's only contribute to the sign of the information, not to the amplitude. FIG. 7 shows the $LLrQ_{Lm}$'s passed from bits to an equation, and FIG. 8 shows the $LLrR_{mL}$'s relayed by the equation.

Figure 12:
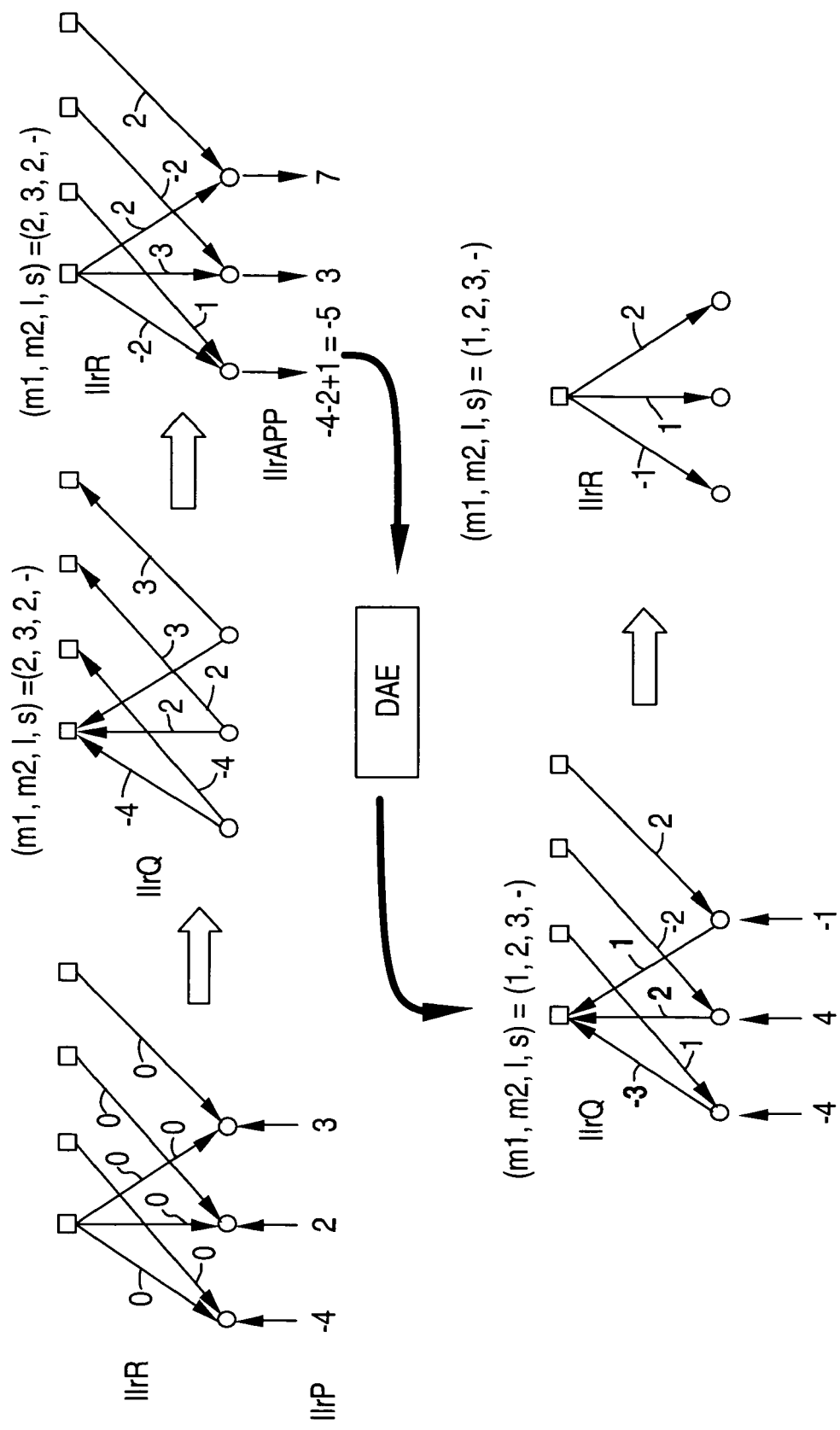
FIG. 12 is a factor graph of the decoding procedure in accordance with the present invention.

A conventional implementation of SP or SSP requires L units of memory to store the $LLrP_L$:'s; L units of memory to store the $LLrAPP_L$'s; ML units of memory to store the $LLrQ_{Lm}$'s; and ML units of memory to store the $LLrR_{mL}$'s. Soft information is updated bit by bit within each iteration. These implementations are referred to as the "bit-based" implementations. As will be appreciated by one of ordinary skill in the art, the bit-based implementations require a large amount of memory and increased hardware complexity. FIG. 12 illustrates an implementation of SSP, which is generally performed in a serial manner. As shown therein, soft channel decoding is performed for the first iteration. Thereafter $LLrQ_{Lm}$ and $LLrR_{ml}$ are sequentially calculated. For subsequent iterations i, decision aided equalization is then performed on the information. After the decision aided equalization iteration $LLrQ_{Lm}$ is calculated in accordance with equation (3), and then $LLrR_{ml}$. is calculated in accordance with equation (4). The conventional process requires, for a 4000 bit codeword, approximately 4000 cycles for soft channel decoding, approximately 4000 cycles for calculating $LLrQ_{Lm}$, approximately 4000 cycles for calculating $LLrR_{ml}$, and approximately 4000 cycles for performing decision aided equalization. The amount of time required by conventional methods degrades performance.

Figure 17:
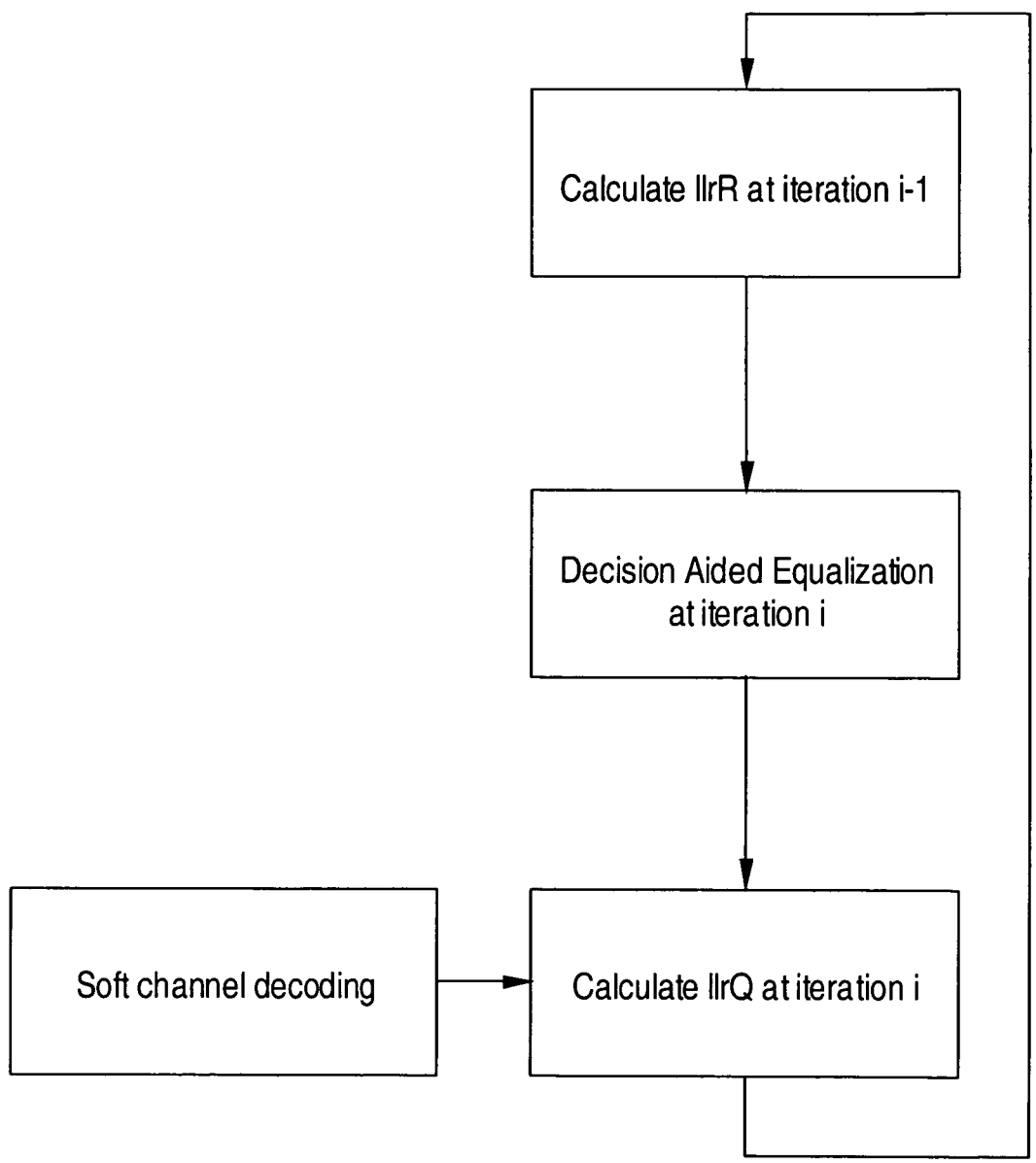
FIG. 17 is a block diagram of a decoding implementation in accordance with the present invention.

In accordance with the present invention, a pipelined architecture is proposed for the SSP circuit, as shown in FIG. 17. In accordance with the present invention, soft channel decoding is performed to initialize the SSP circuit, and for iteration i, $LLrQ_{Lm}^I$ is calculated. At the same time $LLrR_{ml}^{I-1}$ for iteration i−1 is also calculated. Based on this result and $LLrAPP_L$ decision aided equalization is then performed. As can be appreciated by one of ordinary skill in the art, the pipelined architecture allows for reduced pendency, resulting in higher throughput. In accordance with the present invention, each iteration takes about 4000 cycles for a 4000 bit codeword. According to another aspect of the present invention, an "equation-based" arrangement is proposed which implements the same algorithm with much less hardware complexity as described herein below.

The "equation-based" arrangement takes advantage of both the sparseness of the parity-check matrix and the simplicity in the SSP decoding. It is noted that the number of equations for each bit involved corresponds to the column weight of the parity check matrix, which in the preferred embodiment is three. Of course other appropriate column weights may be employed. According to equation (7), each equation node only passes two values to the connected bit nodes if signs of the soft information are not considered. Therefore, there is only a need to store two LLR magnitudes for each equation, and the signs for all the $LLrQ_{Lm}$'s. for each equation, the two smallest LLR's (min1 and min2), the position of min1 (i), and the sign of the equation (s); for each bit are stored. Additionally, three signs are stored corresponding to the signs of three $LLrQ_{Lm}$'s from the previously iteration. $LLrR_{Lm}$'s can be calculated from the stored information as follows:

$$llrR_{ml}^{i-1} = \begin{cases} -s_m^{i-1} \cdot \text{sign}(llrQ_{lm}^{i-1}) \cdot \text{min1}_m^{i-1}, & \text{if } l \neq i_m^{i-1} \\ -s_m^{i-1} \cdot \text{sign}(llrQ_{lm}^{i-1}) \cdot \text{min2}_m^{i-1}, & \text{otherwise.} \end{cases}$$

where $$s_m^i = (-1) \prod_l -\text{sign}(LLrQ_{Lm}^i)$$

is the sign of the mth equation

Figure 5:
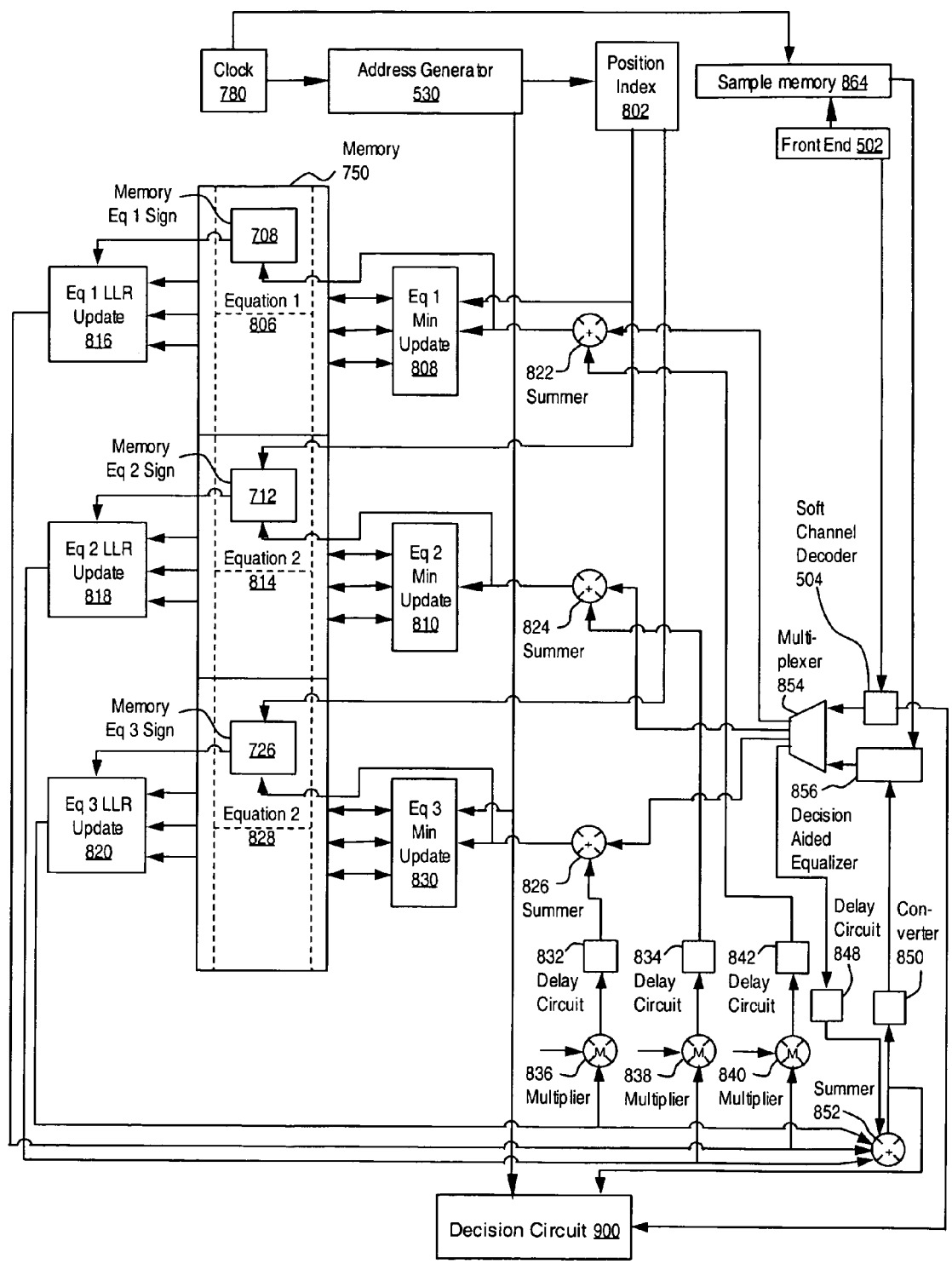
FIG. 5 is a block diagram of the decoder in accordance with the present invention.
Figure 13:
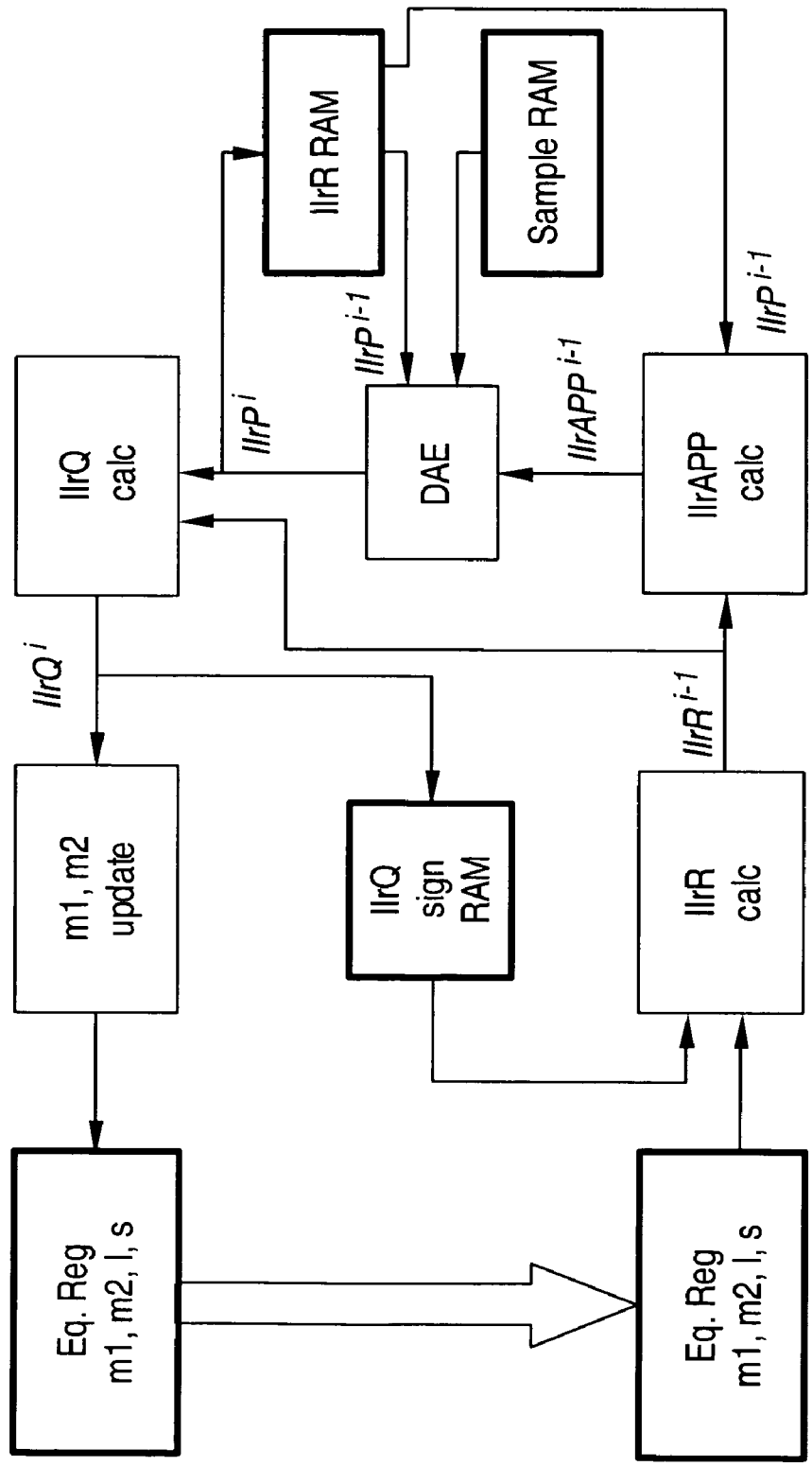
FIG. 13 is a flow diagram of the decoding procedure in accordance with the present invention.

Referring to block diagram in FIG. 5, the corresponding flow chart in FIG. 13, and the corresponding factor graph in FIG. 12, the "equation-based" SSP circuit performs the following process:

1. The equation-based SSP circuit is initialized with the output of soft channel decoder 504 for the calculation of $LLrP_L$, which is selected by multiplexer 854. During subsequent iterations, multiplexer 854 selects the output of decision aided equalization circuit 856, as discussed hereinbelow 2. At each time clock, address generator 530 calculates the indices of each equation for the current bit, and position index generator 802 calculates the position index thereof. Three $LLrR_{ml}$'s are calculated using Equation 8 by a calculating means or calculator or equation 1 LLR update circuit 816, equation 2 LLR update circuit 818, and equation 3 LLR update circuit 820.

3. Each bit calculates the information that it passes to the connecting equations by calculating means or calculator as follows, $$llrQ_{lm}^i = llrP_l^i + \sum_{m' \neq m} llrR_{m'l}^{i-1} \quad (9)$$

The $LLrR_{ml}$'s are multiplied by a scaling factor by multipliers 836, 838 and 840 respectively to reduce circulation of any errors. The $LLrR_{ml}$'s are also delayed by delay circuits 832, 834, and 842, respectively, to synchronize with $LLrP_L$.

Each bit stores the three signs of the LLrQ's in memory means or memory sections 708, 712 and 726 for equations 1, 2 and 3 respectively.

Each bit updates the equation information (min1, min2, i, and s) for the three equations involving the current bit by equation 1 update circuit 808, equation 2 update circuit 810, and equation 3 update circuit 830, respectively, in accordance with the following procedure:

If
    $|llrQ_{lm}^f| < \text{min1}_{ml}$
        $\text{min1}_m^f \rightarrow \text{min2}_m^f$
        $|llrQ_{lm}^f| \rightarrow \text{min1}_m$
        $l \rightarrow l_m^f$
    else if         $|llrQ_{lm}^f| < \text{min2}_{ml}$
                $|llrQ_{lm}^f| \rightarrow \text{min1}_m$
                $s_m^f = s_m^f \cdot \text{sign}(llrQ_{lm}^f)$
    endif Each bit calculates the overall soft information by summing up all the $LLrR_{ml}$'s, and $LLrP_L$ (via delay circuit 848) as an input to decision aided equalizer 856.

$$llrAPP_i = \sum_m llrR^i_{ml} + llrP_l.$$

Figure 9:
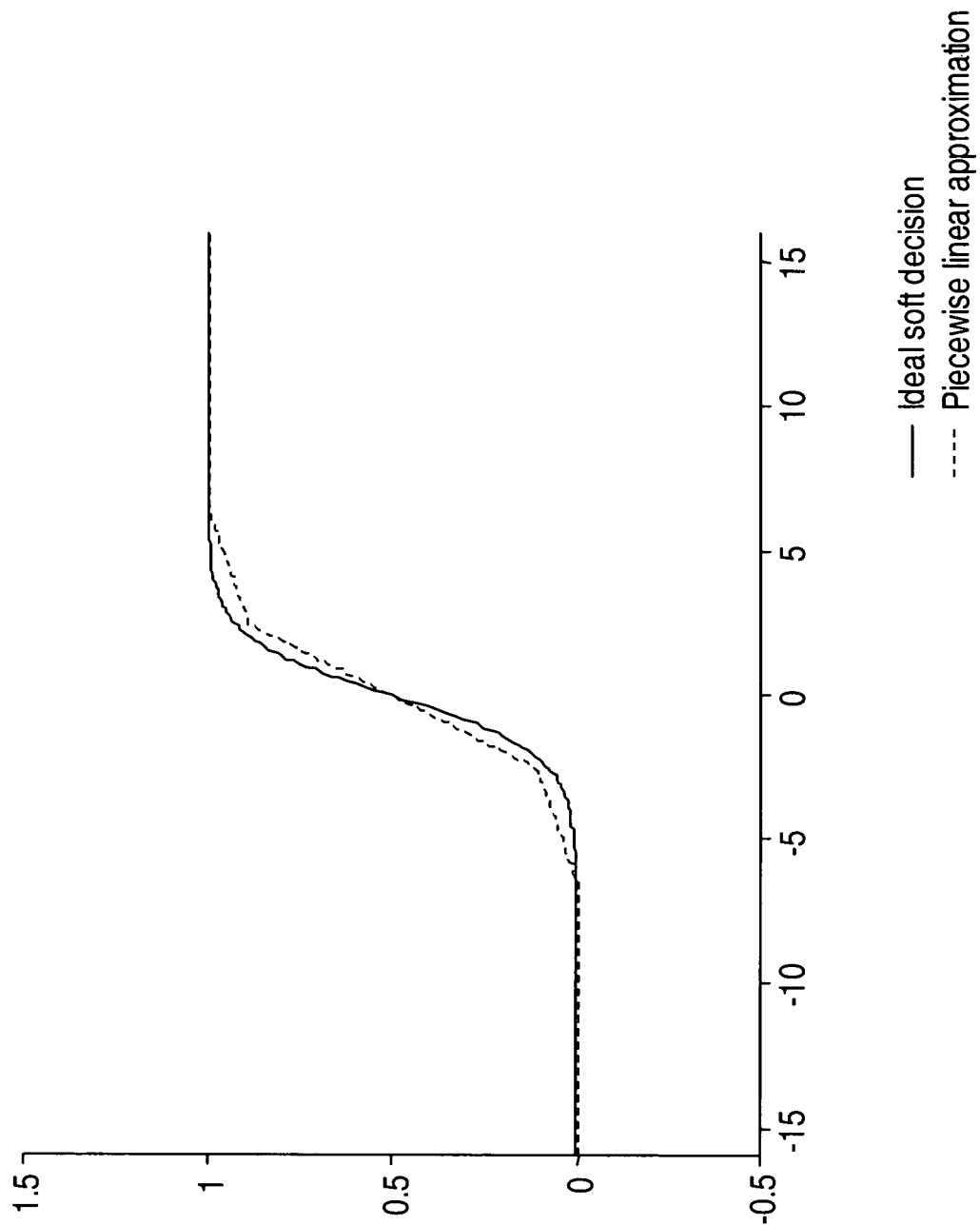
FIG. 9 is a graph of a function for calculating a soft decision.

Log-likelihood ratios are converted to probability information by converter 850. Converter 850 implements the function shown in FIG. 9. In the preferred embodiment, the function is implemented as a piecewise linear approximation, shown as the dashed lines in FIG. 9. Decision aided equalizer 856 processes LLrAPP$_L$ and samples stored in samples memory 864 from an equalizer (not shown) in front end 502. Decision aided equalization is described in more detail by Zining Wu in *Coding and Iterative Detection For Magnetic Recording Channels,* 2000, Kluwer Academic Publishers, the contents of which are incorporated in its entirety by reference.

Decision circuit 900, which is responsive to the output of summer 852, address generator 530 and soft channel decoder 504 determines when to terminate this iterative process, as is described in detail below.

Figure 4:
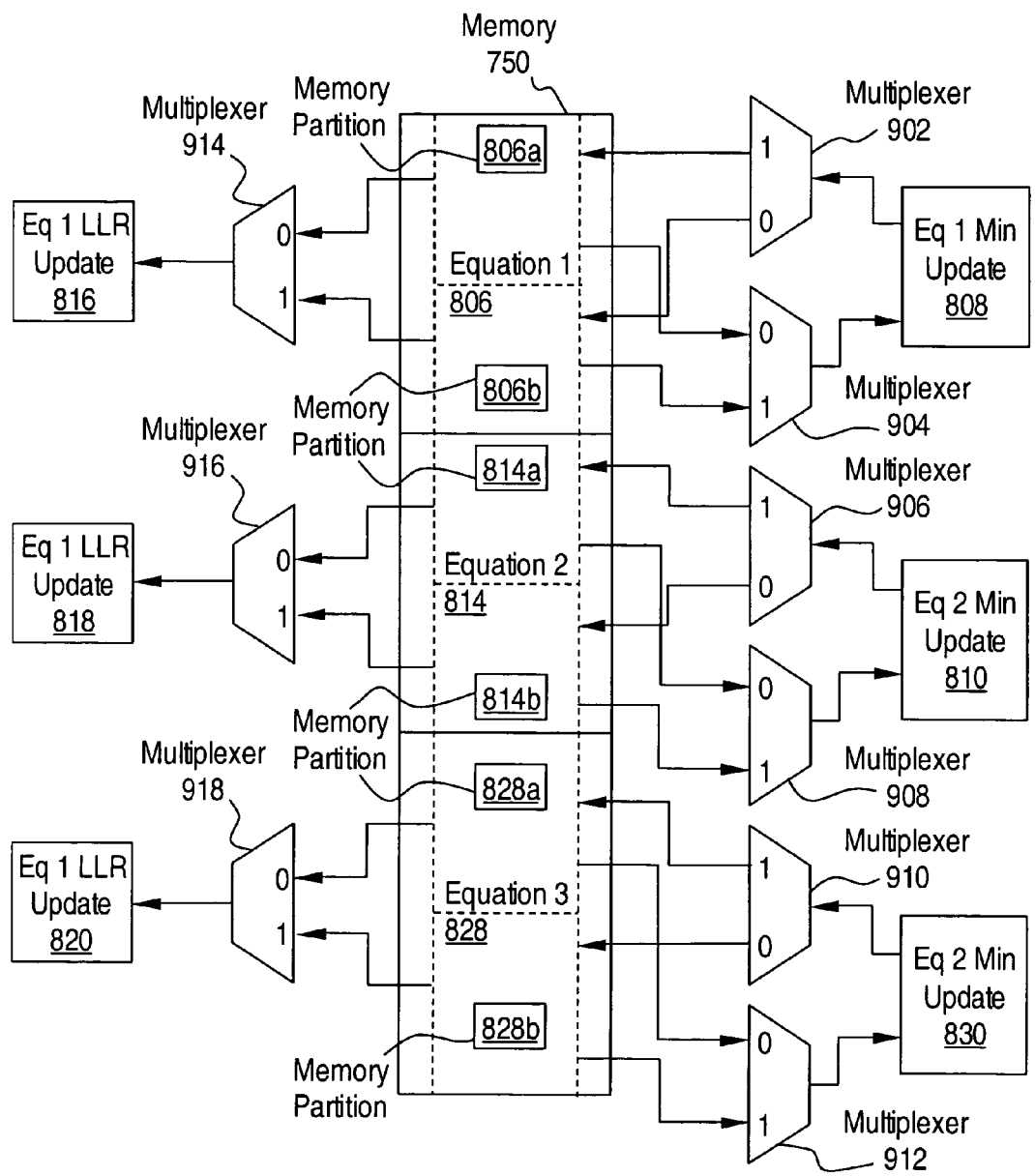
FIG. 4 is a block diagram of a memory arrangement of the decoder in accordance with the present invention.

FIG. 4 is a block diagram of a memory arrangement of the decoder in accordance with the present invention. As shown therein, memory or memory means 750 has a partition for each equation, and each equation has a partition for storing magnitude data, index data and sign data for iteration i and for iteration i−1. As used herein, the term partition refers either to a physical memory partition or a logical memory partition. Equation 1 update circuit 808, for each clock cycle, writes during iteration i to memory partition 806a or memory partition 806b i, and reads data previously stored from iteration i−1 from memory partition 806b or memory partition 806a. Multiplexer 902 selects the memory partition for write operations and multiplexer 904 selects the memory partition for read operations. Equation 1 LLR update circuit 816 reads data previously stored from iteration i−1 from memory partition 806b or memory partition 806a as selected by multiplexer 914. Equation 2 update circuit 810, equation 3 update circuit 830, equation 2 LLR update circuit 818, and equation 3 LLR update circuit 820 operate similarly.

Figure 10:
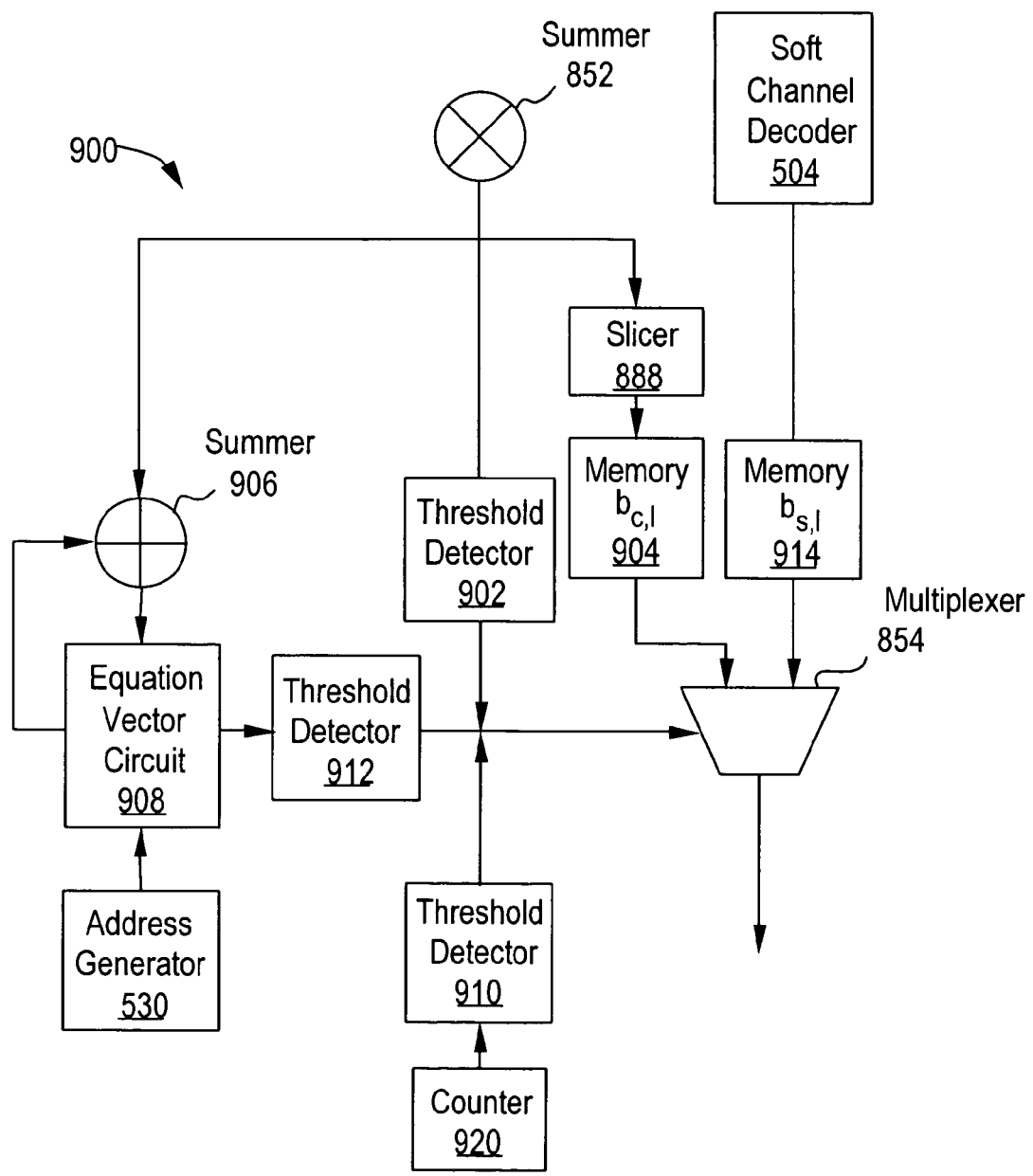
FIG. 10 is a block diagram of a decision circuit of the decoder of FIG. 5.
Figure 14:
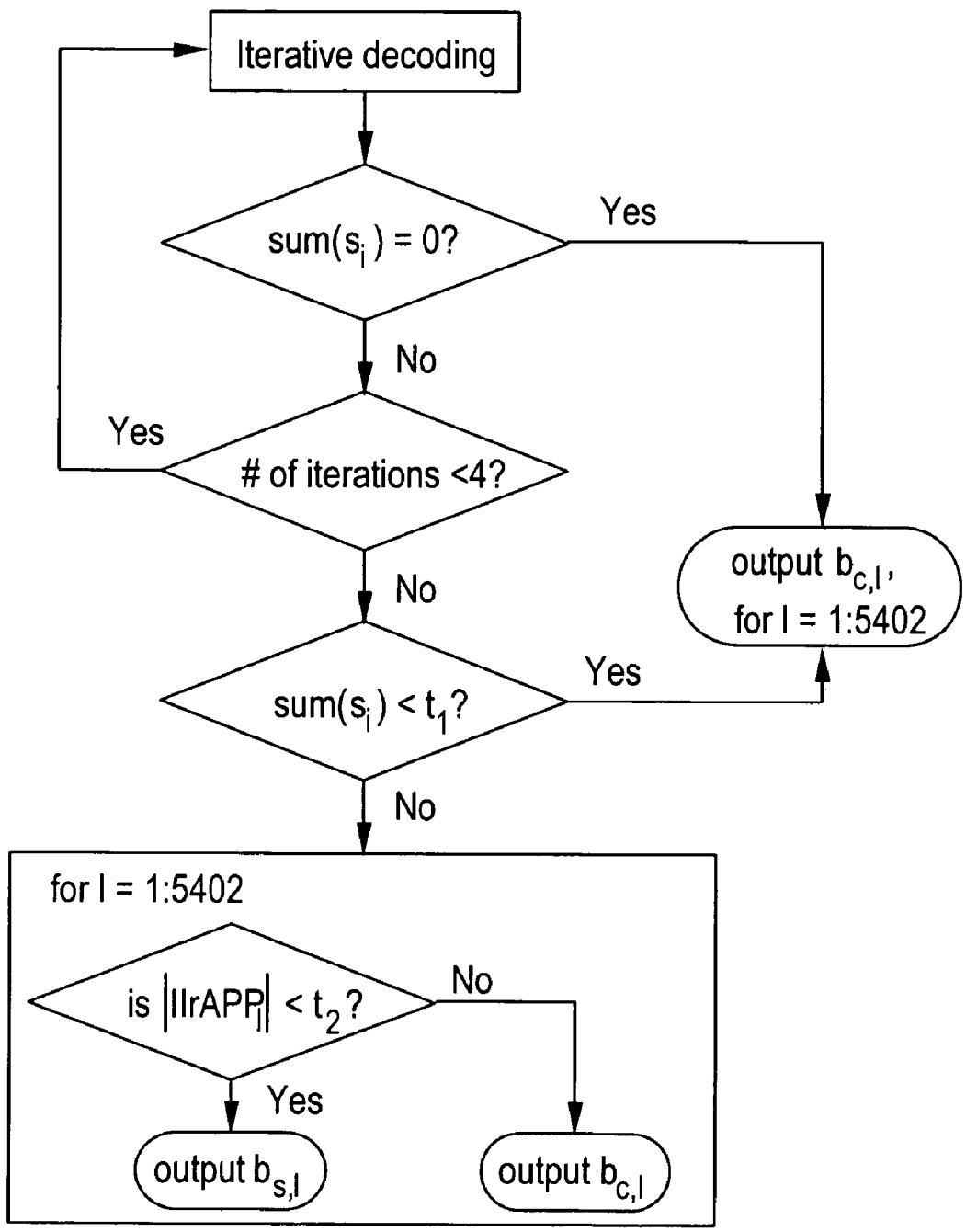
FIG. 14 is a flow chart of the decision procedure of the decision circuit of FIG. 10.

FIG. 10 is a block diagram of decision circuit 900, and FIG. 14 is a flow chart thereof. Decision circuit 900 is responsive to the output from soft channel decoder 504, LLrAPP$_L$ from summer or summing means 852 and address generator or address generator means 530. Decision circuit 900 comprises memory 914 for storing hard decision data b$_{s,l}$ (for l=1:5402) from soft channel decoder 504, slicer or slicing means 888 for converting |LLrAPP$_L$| information into hard information b$_{c,l}$ memory 904 for storing b$_{c,l}$, a threshold detector 902 to determine if |LLrAPP$_L$| from summer 852 is less then a threshold value (t$_2$). Decision circuit or decision means 900 further comprises counter 920 for counting the number of iterations performed by the decoder and threshold detector 910 to determine if the number of iterations exceeds threshold value t$_3$, which in the preferred embodiment is four. Equation vector circuit or equation vector means 908 determines the equation syndromes, one for each equation, S$_m$, m=1:222 in which S$_m$=0 when equation i is satisfied or S$_m$=1 when equation m is violated. Summer 906 sums each of the S$_m$, m=1:222.

The operation of decision circuit 900 will now be explained in conjunction with the flow chart of FIG. 14. After an iteration of iterative decoding, the equation syndrome is calculated by equation vector circuit 908 and summed by summer or summing means 906. Threshold circuit 912 determines if the sum of all S$_m$=0, then a signal is sent to multiplexer 854 to output b$_{c,l}$ from memory 904. If the sum of all S$_m$≠0, then a determination is made by threshold detector 910 whether the number of iterations is less than threshold value t$_3$. If the number of iterations is less than threshold value t$_3$, the next iteration is performed. Otherwise threshold circuit 912 determines if the sum of all S$_m$ is less than threshold t$_1$. If so, then a signal is sent to multiplexer 854 to output b$_{c,l}$ from memory 904. Alternatively, the next step in the process is to determine if |LLrAPP$_L$| is less then threshold value (t$_2$), if so, multiplexer 854 selects b$_{s,l}$ to be output. If |LLrAPP$_L$| is not less then threshold value (t$_2$), multiplexer 854 selects b$_{c,l}$ to be output.

Figure 11:
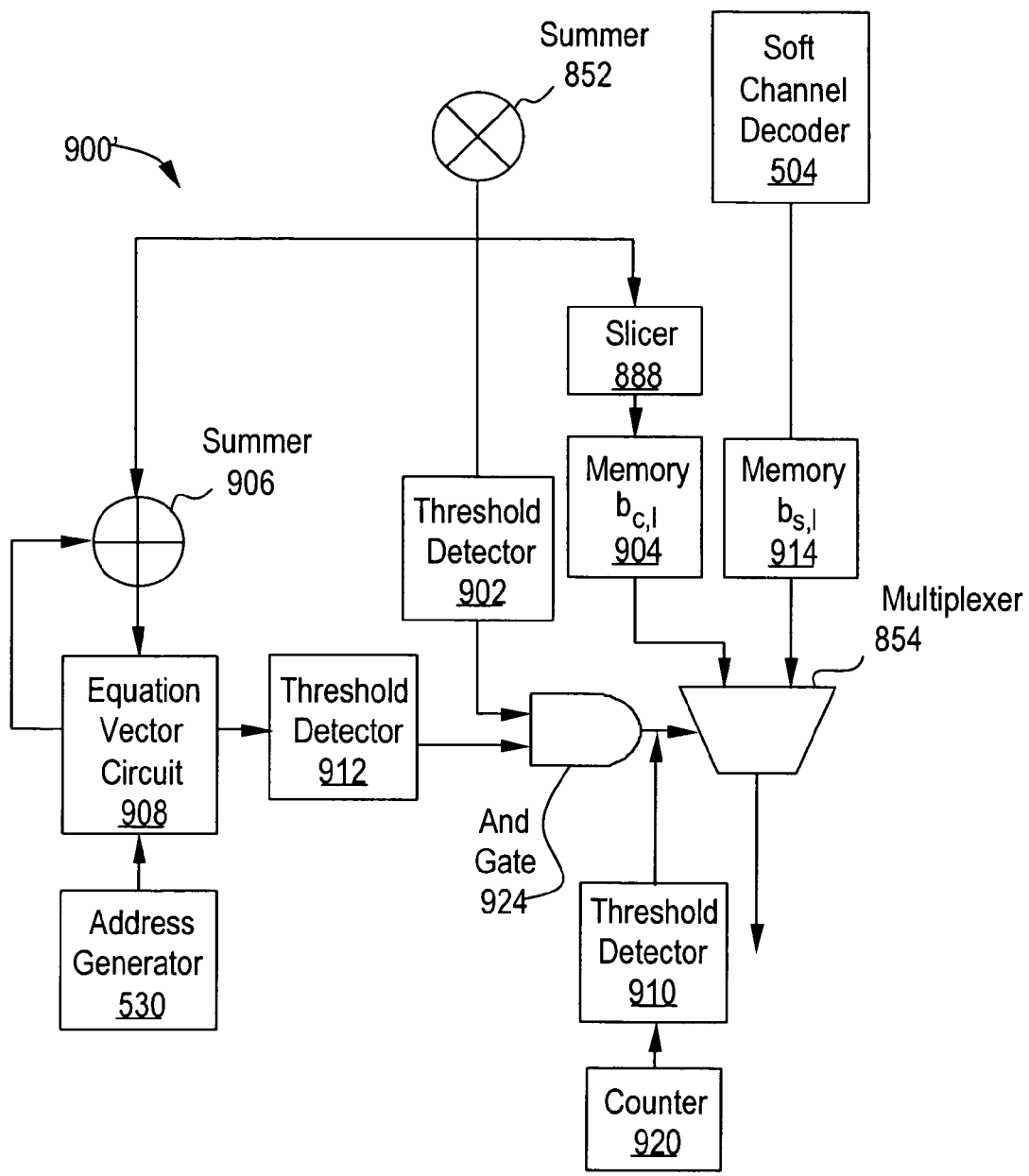
FIG. 11 is a block diagram of an alternate decision circuit of the decoder of FIG. 5.
Figure 15:
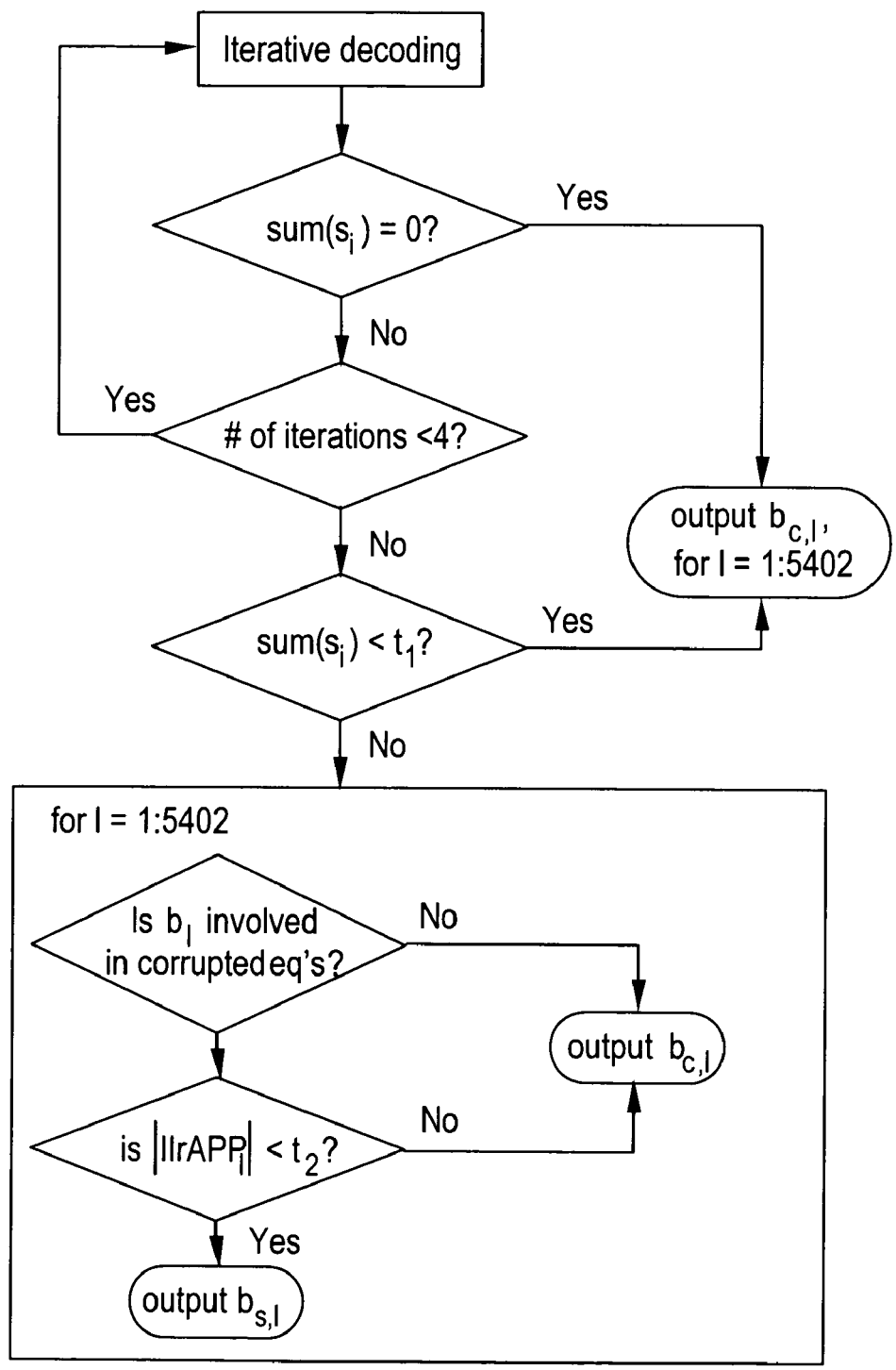
FIG. 15 is a flow chart of the decision procedure of the alternate decision circuit of FIG. 11.
Figure 16:
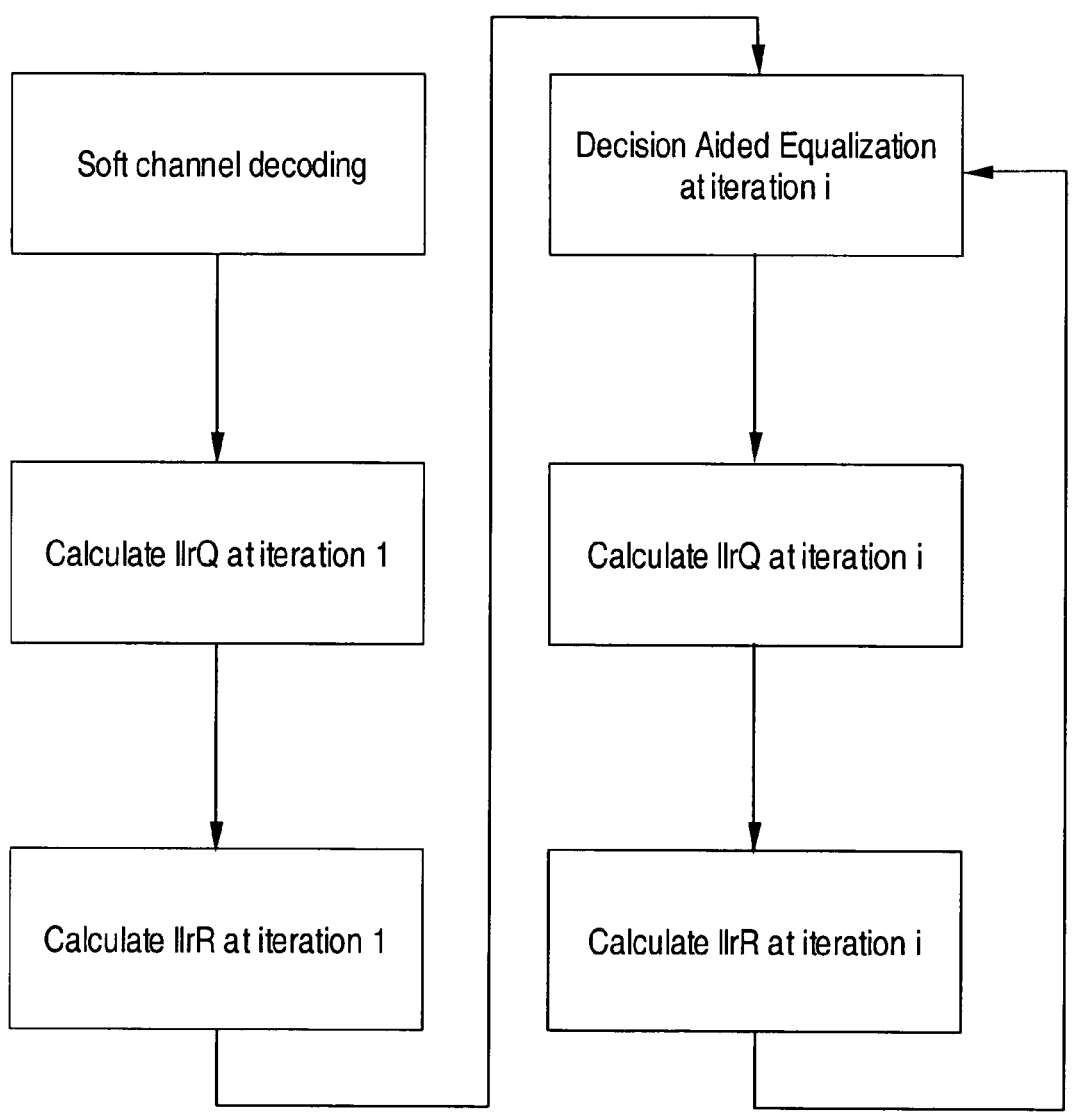
FIG. 16 is a block diagram of a conventional decoding implementation.

FIG. 11 is a block diagram of decision circuit 900' and FIG. 15 is a flow chart thereof. Decision circuit 900' is responsive to the output from soft channel decoder 504, LLrAPP$_L$ from summer 852 and address generator 530. Decision circuit 900' comprises memory 914 for storing hard decision data b$_{s,l}$ (for l=1:5402) from soft channel decoder 504, slicer 888 for converting |LLrAPP$_L$| information into hard information b$_{c,l}$, memory 904 for storing b$_{c,l}$, a threshold detector 902 to determine if |LLrAPP$_L$| from summer 852 is less then a threshold value (t$_2$). Decision circuit 900' further comprises counter 920 for counting the number of iterations performed by the decoder and threshold detector 910 to determine if the number of iterations exceeds threshold value t$_3$, which in the preferred embodiment is four. Equation vector circuit 908 determines the equation syndromes, one for each equation, S$_m$, i=1:222 in which S$_m$=0 when equation i is satisfied or S$_m$=1 when equation i is violated. Summer 906 sums each of the S$_m$, m=1:222.

The operation of decision circuit 900' will now be explained in conjunction with the flow chart of FIG. 15. After an iteration of iterative decoding, the equation syndrome is calculated and summed by equation vector circuit 908 and summer 906. Threshold circuit 912 determines if the sum of all S$_m$=0, then a signal is sent to multiplexer 854 to output b$_{c,l}$ from memory 904. If the sum of all S$_m$≠0, then a determination is made by threshold detector 910 whether the number of iterations is less than threshold value t$_3$. If the number of iterations is less than threshold value t$_3$, the next iteration is performed. Otherwise threshold circuit 912 determines if the sum of all S$_m$ is less than threshold t$_1$. If so, then a signal is sent to multiplexer 854 to output b$_{c,l}$ from memory 904. Alternatively, the next step in the process is to determine if b$_l$ is involved in an equation that is violated. If b$_l$ is not involved in an equation that is violated, multiplexer 854 selects b$_{c,l}$ as the output. Otherwise threshold detector 902 determines if |LLrAPP$_l$| is less then threshold value (t$_2$), if so multiplexer 854 selects b$_{s,l}$ to be output. If |LLrAPP$_l$| is not less then threshold value (t$_2$), multiplexer 854 selects b$_{c,l}$ to be output.

While the invention has been described in conjunction with several specific embodiments, it is evident to those skilled in the art that many further alternatives, modifications and variations will be apparent in light of the foregoing description. More specifically, while the present invention is preferably implemented as an integrated circuit, it is contemplated that the present invention may also be implemented as discrete components or a general-purpose processor operated in accordance with program code instructions or computer program or combination thereof. These program code instructions can be obtain from a medium, such as network, local area network, the Internet, or storage devices. Such storage devices include, by way of example, magnetic storage devices, optical storage devices, electronic storage devices, magneto-optical device and the like. Thus, the invention described herein is intended to embrace all such alternatives, modifications, applications and variations as may fall within the spirit and scope of the appended claims.

What is claimed is:

1. A decoder for decoding low-density parity-check codes comprising:
   a first calculator to calculate $LLrR_{ml}$, for each parity check equation, at iteration i−1;
   a detector to detect $LLrP_L$, at iteration i, in response to the first calculator; and
   a second calculator to calculate $LLrQ_{Lm}$, for each parity check equation, at iteration i in response to the detector,
   wherein $LLrP_L$ comprises soft information at iteration i in response to the detector, one for each bit,
   wherein $LLrQ_{Lm}$ represents information from bit node l to equation node m, one for each connection,
   wherein $LLrR_{ml}$, represents information from equation node m to bit node l, one for each connection, and
   wherein the first calculator is responsive to the second calculator.

2. The decoder of claim 1 further comprising:
   a memory to store for each parity check equation:
      the smallest $LLrQ_{Lm}$ calculated by the second calculator, at iteration i;
      the second smallest $LLrQ_{Lm}$ calculated by the second calculator, at iteration i; and
      an overall sign of $LLrQ_{Lm}$, calculated by the second calculator, at iteration i,
   wherein the first calculator is responsive to the memory, and
   wherein the second calculator is responsive to the first calculator.

3. The decoder of claim 2 wherein the first calculator calculates as follows, wherein $s^i_m$ comprises a sign of the mth equation:

$$llrR_{ml}^{i-1} = \begin{cases} -s_m^{i-1} \cdot \text{sign}(llrQ_{lm}^{i-1}) \cdot \min1_m^{i-1}, & \text{if } l \neq l_m^{i-1} \\ -s_m^{i-1} \cdot \text{sign}(llrQ_{lm}^{i-1}) \cdot \min2_m^{i-1}, & \text{otherwise.} \end{cases}$$

4. The decoder of claim 2 wherein the second calculator calculates as follows:

$$llrQ_{lm}^i = llrP_l^i + \sum_{m' \neq m} llrR_{m'l}^{i-1}$$

wherein $LLrP_L$ comprises soft information at iteration i in response to the detector, one for each bit.

5. The decoder of claim 2 wherein the second calculator is initialized with soft channel information.

6. The decoder of claim 2 further comprising an address generator for providing indices of each of the parity check equations.

7. The decoder of claim 2 wherein the second calculator provides an index of the smallest $LLrQ_{Lm}$.

8. The decoder of claim 2 further comprising a multiplier to scale $LLrR_{ml}$, calculated by the first calculator.

9. The decoder of claim 2 further comprising a slicer to convert $|LLrAPP_l|$ information into hard information $b_{c,l}$, wherein $LLrAPP_l$ comprises overall soft information after each iteration i, one for each bit;
   an equation vector circuit to calculate an equation syndrome for each parity check equation, $s_i$.

10. The decoder of claim 9 further comprising:
   a summer to sum each equation syndrome calculated by the equation vector circuit;
   wherein the hard information is output if the sum summed by the summer i is equal to zero; and
   wherein the calculations by the first and second calculator are repeated if the sum summed by the summer is not equal to zero.

11. The decoder of claim 10 further comprising:
   a first threshold detector to determine if i is less than a first predetermined value;
   wherein the calculations by the first and second calculator are repeated if i is less than the first predetermined value as determined by the first threshold detector; and
   a second threshold detector to determine if the sum by the summer is less than a second predetermined value; and
   wherein the hard information is output if i is at least the first predetermined value or the sum by the summing means is less than the second predetermined value.

12. The decoder of claim 11 further comprising:
   a third threshold detector to determine for each data l if $|LLrAPP_l|$ is less than a third predetermined value;
   wherein for each data l, outputting hard information $b_{c,l}$ if $|LLrAPP_l|$ is at least the third predetermined value as determined by the third threshold detector; and
   wherein for each data l, outputting soft channel information $b_{s,l}$ if $|LLrAPP_l|$ is less than the third predetermined value as determined by the third threshold detector.

13. The decoder of claim 11 further comprising:
   a judging circuit to determine for each data l if a corresponding parity check equation is violated;
   wherein for each data l, outputting hard information $b_{c,l}$, if the corresponding parity check equation is not violated as determined by the judging circuit;
   a third threshold detector to determine for each data l if $|LLrAPP_l|$ is less than a third predetermined value;
   wherein for each data l, outputting hard information $b_{c,l}$ if $|LLrAPP_l|$ is at least the third predetermined value as determined by the third threshold detector; and
   wherein for each data l, outputting soft channel information $b_{s,l}$ based on information from a soft channel decoder if $|LLrAPP_l|$ is less than the third predetermined value as determined by the third threshold detector.

14. A decoder for decoding low-density parity-check codes comprising:
   first calculating means for calculating $LLrR_{ml}$, for each parity check equation, at iteration i−1;
   detecting means for detecting $LLrP_L$, at iteration i, in response to the first calculating means; and
   second calculating means for calculating $LLrQ_{Lm}$, for each parity check equation, at iteration i in response to the detecting means,
   wherein $LLrP_L$ comprises soft information at iteration i in response to the detecting means, one for each bit,
   wherein $LLrQ_{Lm}$ represents information from bit node l to equation node m, one for each connection,
   wherein $LLrR_{ml}$ represents information from equation node m to bit node l, one for each connection, and
   wherein the first calculating means is responsive to the second calculating means.

15. The decoder of claim 14 further comprising:
   storing means for storing each parity check equation:
      the smallest $LLrQ_{Lm}$ calculated by the second calculating means, at iteration i;
      the second smallest $LLrQ_{Lm}$ calculated by the second calculating means, at iteration i; and
      an overall sign of $LLrQ_{Lm}$, calculated by the second calculating means, at iteration i,
      wherein the first calculating means is responsive to the storing means, and wherein the second calculating means is responsive to the first calculating means.

16. The decoder of claim 15 wherein the first calculating means calculates as follows, wherein $s^i_m$ comprises a sign of the mth equation:

$$llrR^{i-1}_{ml} = \begin{cases} -s^{i-1}_m \cdot \text{sign}(llrQ^{i-1}_{lm}) \cdot \text{min1}^{i-1}_m, & \text{if } l \neq l^{i-1}_m \\ -s^{i-1}_m \cdot \text{sign}(llrQ^{i-1}_{lm}) \cdot \text{min2}^{i-1}_m, & \text{otherwise.} \end{cases}$$

17. The decoder of claim 15 wherein the second calculating means calculates as follows:

$$llrQ^i_{lm} = llrP^i_l + \sum_{m' \neq m} llrR^{i-1}_{m'l}$$

wherein $LLrP_L$ comprises soft information at iteration i in response to the detecting means, one for each bit.

18. The decoder of claim 15 wherein the second calculating means is initialized with soft channel information.

19. The decoder of claim 15 further comprising address generating means for providing indices of each of the parity check equations.

20. The decoder of claim 15 wherein the second calculating means provides an index of the smallest $LLrQ_{Lm}$.

21. The decoder of claim 15 further comprising multiplying means for scaling $LLrR_{ml}$, calculated by the first calculating means.

22. The decoder of claim 15 further comprising slicing means for converting $|LLrAPP_l|$ information into hard information $b_{c,l}$, wherein $LLrAPP_l$ comprises overall soft information after each iteration i, one for each bit; and equation vector means for calculating an equation syndrome for each parity check equation, $s_i$.

23. The decoder of claim 22 further comprising:
summing means for summing each equation syndrome calculated by the equation vector means;
wherein the hard information is output if the sum summed by the summing means is equal to zero; and
wherein the calculations by the first and second calculating means are repeated if the sum summed by the summing means is not equal to zero.

24. The decoder of claim 23 further comprising:
first threshold detecting means for determining if i is less than a first predetermined value;
wherein the calculations by the first and second calculating means are repeated if i is less than the first predetermined value as determined by the first threshold detecting means; and
second threshold detecting means for determining if the sum by the summing means is less than a second predetermined value; and
wherein the hard information is output if i is at least the first predetermined value or the sum by the summing means is less than the second predetermined value.

25. The decoder of claim 24 further comprising:
third threshold detecting means for determining for each data l if $|LLrAPP_l|$ is less than a third predetermined value;
wherein for each data l, outputting hard information $b_{c,l}$ if $|LLrAPP_l|$ is at least the third predetermined value as determined by the third threshold detecting means; and wherein for each data l, outputting soft channel information $b_{s,l}$ if $|LLrAPP_l|$ is less than the third predetermined value as determined by the third threshold detecting means.

26. The decoder of claim 24 further comprising:
judging means for determining for each data l if a corresponding parity check equation is violated;
wherein for each data l, outputting hard information $b_{c,l}$ if the corresponding parity check equation is not violated as determined by the judging means;
third threshold detecting means for determining for each data l if $|LLrAPP_l|$ is less than a third predetermined value;
wherein for each data l, outputting hard information $b_{c,l}$ if $|LLrAPP_l|$ is at least the third predetermined value as determined by the third threshold detecting means; and
wherein for each data l, outputting soft channel information $b_{s,l}$ based on information from a soft channel decoder if $|LLrAPP_l|$ is less than the third predetermined value as determined by the third threshold detecting means.

27. A method for operating a decoder for decoding low-density parity-check codes comprising:
calculating $LLrR_{ml}$, for each parity check equation, at iteration i−1;
detecting $LLrP_L$, at iteration i; and
calculating $LLrQ_{Lm}$, for each parity check equation, at iteration i in response to the detecting,
wherein $LLrP_L$ comprises soft information at iteration i in response to the detecting means, one for each bit,
wherein $LLrQ_{Lm}$ represents information from bit node l to equation node m, one for each connection,
wherein $LLrR_{ml}$, represents information from equation node m to bit node l, one for each connection.

28. The method of claim 27 further comprising:
storing each parity check equation:
the smallest $LLrQ_{Lm}$ calculated at iteration i;
the second smallest $LLrQ_{Lm}$ calculated at iteration i; and
an overall sign of $LLrQ_{Lm}$, calculated at iteration i.

29. The method of claim 28 wherein calculating $LLrQ_{Lm}$ is calculated as follows, where $s^i_m$ comprises a sign of the mth equation:

$$llrR^{i-1}_{ml} = \begin{cases} -s^{i-1}_m \cdot \text{sign}(llrQ^{i-1}_{lm}) \cdot \text{min1}^{i-1}_m, & \text{if } l \neq l^{i-1}_m \\ -s^{i-1}_m \cdot \text{sign}(llrQ^{i-1}_{lm}) \cdot \text{min2}^{i-1}_m, & \text{otherwise.} \end{cases}$$

30. The method of claim 28 wherein calculating $LLrR_{ml}$ is performed as follows:

$$llrQ^i_{lm} = llrP^i_l + \sum_{m' \neq m} llrR^{i-1}_{m'l}$$

wherein $LLrP_L$ comprises soft information at iteration i in response to the detecting, one for each bit.

31. The method of claim 28 wherein calculating $LLrR_{ml}$ is initialized with soft channel information.

32. The method of claim 28 further comprising providing indices of each of the parity check equations.

33. The method of claim 28 further comprising providing an index of the smallest $LLrQ_{Lm}$.

34. The method of claim 28 further comprising scaling $LLrR_{ml}$.

35. The method of claim 28 further comprising
converting $|\text{LLrAPP}_l|$ information into hard information $b_{c,l}$, wherein $\text{LLrAPP}_l$ comprises overall soft information after each iteration i, one for each bit;
calculating an equation syndrome for each parity check equation, $s_i$.

36. The method of claim 35 further comprising:
summing each equation syndrome;
wherein the hard information is output if the sum i is equal to zero; and
wherein calculating $\text{LLrQ}_{Lm}$ and $\text{LLrR}_{ml}$ is repeated if the sum is not equal to zero.

37. The method of claim 36 further comprising:
determining if i is less than a first predetermined value;
wherein calculating $\text{LLrQ}_{Lm}$ and $\text{LLrR}_{ml}$ is repeated if i is less than the first predetermined value; and
determining if the sum is less than a second predetermined value; and
wherein the hard information is output if i is at least the first predetermined value or the sum is less than the second predetermined value.

38. The method of claim 37 further comprising:
determining for each data l if $|\text{LLrAPP}_l|$ is less than a third predetermined value;
outputting hard information $b_{c,l}$ for each data l if $|\text{LLrAPP}_l|$ is at least the third predetermined value; and
outputting soft channel information $b_{s,l}$ for each data l if $|\text{LLrAPP}_l|$ is less than the third predetermined value.

39. The method of claim 37 further comprising:
determining for each data l if a corresponding parity check equation is violated;
outputting hard information $b_{c,l}$ for each data/if the corresponding parity check equation is not violated;
determining for each data l if $|\text{LLrAPP}_l|$ is less than a third predetermined value;
outputting hard information $b_{c,l}$ for each data l if $|\text{LLrAPP}_l|$ is at least the third predetermined value; and
outputting soft channel information $b_{s,l}$ for each data/based on information from a soft channel decoder if $|\text{LLrAPP}_l|$ is less than the third predetermined value.

\* \* \* \* \*

UNITED STATES PATENT AND TRADEMARK OFFICE
CERTIFICATE OF CORRECTION

PATENT NO. : 7,453,960 B1
APPLICATION NO. : 11/397318
DATED : November 18, 2008
INVENTOR(S) : Zining Wu et al.

It is certified that error appears in the above-identified patent and that said Letters Patent is hereby corrected as shown below:

| | |
|---|---|
| Column 1, Line 33 | Insert -- of -- after "decoder" |
| Column 2, Line 16 | Delete "Deinterleaver" |
| Column 1, Line 41 | Delete "maybe" and insert -- may be -- |
| Column 3, Line 46 | Delete "maybe" and insert -- may be -- |
| Column 4, Line 9 | Insert -- of -- after "pair" |
| Column 6, Line 60 | Delete "(1+e$_{-lal}$)" and insert -- (1+e$^{-lal}$) -- |
| Column 7, Line 44 | Insert -- . -- after "throughput" |
| Column 7, Line 65 | Delete "previously" and insert -- previous -- |
| Column 8, Line 55-63 | Delete equation |

"
$$\text{If } |llrQ^r_{lm}| < min1_{m},$$
$$min1^r_{m} \to min2^r_{m}$$
$$|llrQ^r_{lm}| \to min1_{m}$$
$$l \to l^r_{m}$$
$$\text{else if } |llrQ^r_{lm}| < min2_{m},$$
$$|llrQ^r_{lm}| \to min1_{m}$$
$$s^r_{m} = s^r_{m} \cdot sign(llrQ^r_{lm})$$
$$\text{endif}$$
"

and insert the following:

-- 
$$\text{If } \left|llrQ^i_{lm}\right| < min1^i_{m},$$
$$min1^i_{m} \to min2^i_{m}$$
$$\left|llrQ^i_{lm}\right| \to min1^i_{m}$$
$$l \to I^i_{m}$$
$$\text{else if } \left|llrQ^i_{lm}\right| < min2^i_{m},$$
$$\left|llrQ^i_{lm}\right| \to min2^i_{m}$$
$$\text{end if } s^i_{m} = -s^i_{m} \cdot sign\,(llrQ^i_{lm})$$
--

UNITED STATES PATENT AND TRADEMARK OFFICE
CERTIFICATE OF CORRECTION

PATENT NO.        : 7,453,960 B1
APPLICATION NO.   : 11/397318
DATED             : November 18, 2008
INVENTOR(S)       : Zining Wu et al.

It is certified that error appears in the above-identified patent and that said Letters Patent is hereby corrected as shown below:

Column 10, Line 60            Delete "obtain" and insert -- obtained --
Column 14, Line 30 Claim 27   Delete "means"
Column 16, Line 11 Claim 39   Delete "/" and insert -- 1 --

Signed and Sealed this

Thirty-first Day of March, 2009

JOHN DOLL
*Acting Director of the United States Patent and Trademark Office*